US012812938B2

(12) United States Patent
Chen et al.

(10) Patent No.: US 12,812,938 B2
(45) Date of Patent: Nov. 24, 2026

(54) SEMICONDUCTOR DEVICE STRUCTURE AND METHODS OF FORMING THE SAME

(71) Applicant: TAIWAN SEMICONDUCTOR MANUFACTURING COMPANY, LTD., Hsinchu (TW)

(72) Inventors: Wen-Yen Chen, Hsinchu (TW); Min-Tsang Li, Hsinchu (TW); Liang-Yin Chen, Hsinchu (TW); Chi On Chui, Hsinchu (TW); Chia-Cheng Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 371 days.

(21) Appl. No.: 18/402,794

(22) Filed: Jan. 3, 2024

(65) Prior Publication Data

US 2025/0107184 A1 Mar. 27, 2025

Related U.S. Application Data

(60) Provisional application No. 63/540,920, filed on Sep. 27, 2023.

(51) Int. Cl.
*H10D 62/13* (2025.01)
*H10D 30/01* (2025.01)
(Continued)

(52) U.S. Cl.
CPC ......... *H10D 62/151* (2025.01); *H10D 30/014* (2025.01); *H10D 30/43* (2025.01);
(Continued)

(58) Field of Classification Search
CPC .. H10D 62/151; H10D 30/014; H10D 62/121; H10D 30/6735; H10D 64/62;
(Continued)

(56) References Cited

U.S. PATENT DOCUMENTS 10,510,838 B2 12/2019 Chen et al.
10,868,178 B2 12/2020 Liu et al.
(Continued)

FOREIGN PATENT DOCUMENTS

DE 102018008634 A1 5/2019
DE 102021100270 A1 12/2021

*Primary Examiner* — Robert J Michaud

(74) *Attorney, Agent, or Firm* — NZ Carr Law Office

(57) ABSTRACT

A semiconductor device structure and methods of forming the same are described. The method includes forming a fin structure from a substrate, depositing a first semiconductor material on a first semiconductor layer of the fin structure, depositing a second semiconductor material on the first semiconductor material, depositing an interlayer dielectric layer over the second semiconductor material, forming an opening in the interlayer dielectric layer to expose the second semiconductor material, and performing a dopant implantation process to form a doped region. The doped region includes a first portion of the second semiconductor material. Then, the method further includes performing an amorphization process to form an amorphous region, and the amorphous region includes a second portion of the second semiconductor material. The method further includes performing an annealing process to recrystallize the amorphous region.

20 Claims, 24 Drawing Sheets

(51) Int. Cl.

| | |
|---|---|
| ***H10D 30/43*** | (2025.01) |
| ***H10D 30/67*** | (2025.01) |
| ***H10D 62/10*** | (2025.01) |
| ***H10D 64/01*** | (2025.01) |
| ***H10D 64/62*** | (2025.01) |
| ***H10P 14/20*** | (2026.01) |
| ***H10P 30/20*** | (2026.01) |

(52) U.S. Cl.
CPC ....... *H10D 30/6735* (2025.01); *H10D 62/121* (2025.01); *H10D 64/0112* (2026.01); *H10D 64/62* (2025.01); *H10P 14/382* (2026.01); *H10P 30/204* (2026.01); *H10P 30/21* (2026.01)

(58) Field of Classification Search
CPC .. H10D 30/43; H10D 64/0112; H10P 30/204; H10P 14/382; H10P 30/21
See application file for complete search history.

(56) References Cited

U.S. PATENT DOCUMENTS

| | | | | |
|---|---|---|---|---|
| 11,626,494 | B2 | 4/2023 | Chu et al. | |
| 2020/0006486 | A1 * | 1/2020 | Chen .................... | H10D 62/151 |
| 2022/0310840 | A1 | 9/2022 | Li et al. | |
| 2023/0068065 | A1 | 3/2023 | Khaderbad et al. | |
| 2023/0123484 | A1 | 4/2023 | Lin et al. | |

* cited by examiner

SEMICONDUCTOR DEVICE STRUCTURE AND METHODS OF FORMING THE SAME

CROSS-REFERENCE TO RELATED APPLICATIONS

This application claims priority to U.S. Provisional Application Ser. No. 63/540,920 filed Sep. 27, 2023, which is incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

Therefore, there is a need to improve processing and manufacturing ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
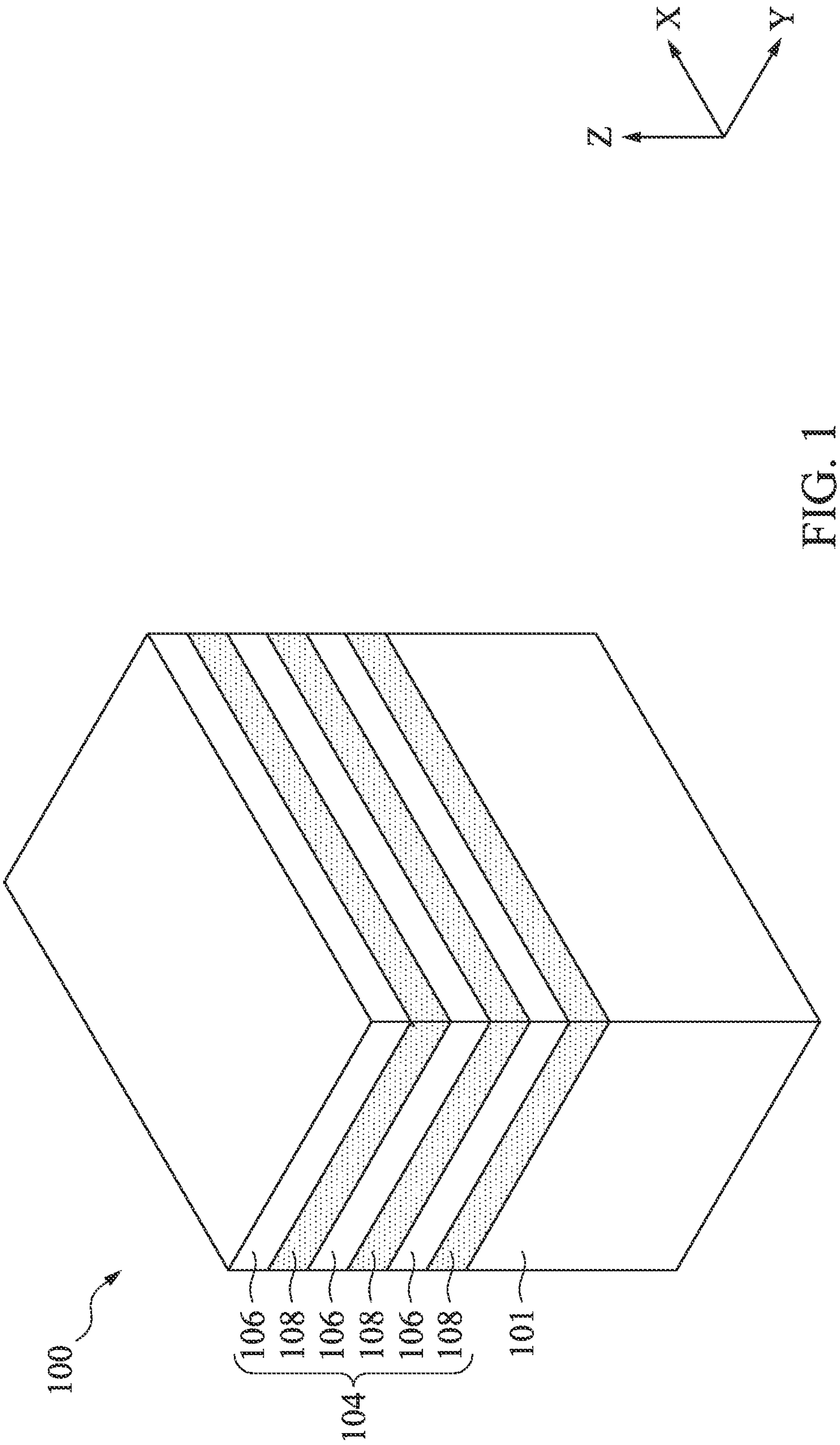
FIGS. 1-5 are perspective views of various stages of manufacturing a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments to be described below relate generally to using a solid phase epitaxy regrowth (SPER) process to increase dopant activation, thereby reducing electrical resistance between two components. In some embodiments, the SPER process includes an amorphization process and an annealing process. The SPER process may be performed on one or more layers of a source/drain region. As a result, contact resistance between the source/drain region and a conductive feature and/or contact resistance between the source/drain region and a channel region (i.e., one or more semiconductor layers) is reduced.

While the embodiments of this disclosure are discussed with respect to nanostructure channel FETs, such as gate all around (GAA) FETs, for example Horizontal Gate All Around (HGAA) FETs or Vertical Gate All Around (VGAA) FETs, implementations of some aspects of the present disclosure may be used in other processes and/or in other devices, such as planar FETs, Fin-FETs, and other suitable devices. A person having ordinary skill in the art will readily understand other modifications that may be made are contemplated within the scope of this disclosure. In cases where gate all around (GAA) transistor structures are adapted, the GAA transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

FIGS. 1-20 show exemplary processes for manufacturing a semiconductor device structure 100 according to embodiments of the present disclosure. It is understood that additional operations can be provided before, during, and after processes shown by FIGS. 1-20, and some of the operations described below can be replaced or eliminated, for additional embodiments of the method. The order of the operations/processes is not limiting and may be interchangeable.

FIGS. 1-5 are perspective views of various stages of manufacturing a semiconductor device structure 100, in accordance with some embodiments. As shown in FIG. 1, a semiconductor device structure 100 includes a stack of semiconductor layers 104 formed over a front side of a substrate 101. The substrate 101 may be a semiconductor substrate. The substrate 101 may include a crystalline semiconductor material such as, but not limited to silicon (Si), germanium (Ge), silicon germanium (SiGe), gallium arsenide (GaAs), indium antimonide (InSb), gallium phosphide (GaP), gallium antimonide (GaSb), indium aluminum arsenide (InAlAs), indium gallium arsenide (InGaAs), gallium antimony phosphide (GaSbP), gallium arsenic antimonide (GaAsSb) and indium phosphide (InP). In some embodiments, the substrate 101 is a silicon-on-insulator (SOI) substrate having an insulating layer (not shown) disposed between two silicon layers for enhancement. In one aspect, the insulating layer is an oxygen-containing layer.

The substrate 101 may include various regions that have been doped with impurities (e.g., dopants having p-type or n-type conductivity). Depending on circuit design, the dopants may be, for example phosphorus for an n-type field effect transistors (NFET) and boron for a p-type field effect transistors (PFET).

The stack of semiconductor layers 104 includes alternating semiconductor layers made of different materials to facilitate formation of nanostructure channels in a multi-gate device, such as nanostructure channel FETs. In some embodiments, the stack of semiconductor layers 104 includes first semiconductor layers 106 and second semiconductor layers 108. In some embodiments, the stack of semiconductor layers 104 includes alternating first and second semiconductor layers 106, 108. The first semiconductor layers 106 and the second semiconductor layers 108 are made of semiconductor materials having different etch selectivity and/or oxidation rates. For example, the first semiconductor layers 106 may be made of Si and the second semiconductor layers 108 may be made of SiGe. In some examples, the first semiconductor layers 106 may be made of SiGe and the second semiconductor layers 108 may be made of Si. Alternatively, in some embodiments, either of the semiconductor layers 106, 108 may be or include other materials such as Ge, SiC, GaAs, GaP, InP, InAs, InSb, GaAsP, AlInAs, AlGaAs, InGaAs, GaInP, GaInAsP, or any combinations thereof.

The first and second semiconductor layers 106, 108 are formed by any suitable deposition process, such as epitaxy. By way of example, epitaxial growth of the layers of the stack of semiconductor layers 104 may be performed by a molecular beam epitaxy (MBE) process, a metalorganic chemical vapor deposition (MOCVD) process, and/or other suitable epitaxial growth processes.

The first semiconductor layers 106 or portions thereof may form nanostructure channel(s) of the semiconductor device structure 100 in later fabrication stages. The term nanostructure is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including, for example, a cylindrical in shape or substantially rectangular cross-section. The nanostructure channel(s) of the semiconductor device structure 100 may be surrounded by a gate electrode. The semiconductor device structure 100 may include a nanostructure transistor. The nanostructure transistors may be referred to as nanosheet transistors, nanowire transistors, gate-all-around (GAA) transistors, multi-bridge channel (MBC) transistors, or any transistors having the gate electrode surrounding the channels. The use of the first semiconductor layers 106 to define a channel or channels of the semiconductor device structure 100 is further discussed below.

Each first semiconductor layer 106 may have a thickness in a range between about 5 nm and about 30 nm. Each second semiconductor layer 108 may have a thickness that is equal, less, or greater than the thickness of the first semiconductor layer 106. In some embodiments, each second semiconductor layer 108 has a thickness in a range between about 2 nm and about 50 nm. Three first semiconductor layers 106 and three second semiconductor layers 108 are alternately arranged as illustrated in FIG. 1, which is for illustrative purposes and not intended to be limiting beyond what is specifically recited in the claims. It can be appreciated that any number of first and second semiconductor layers 106, 108 can be formed in the stack of semiconductor layers 104, and the number of layers depending on the predetermined number of channels for the semiconductor device structure 100. In some embodiments, the stack of semiconductor layers 104 includes two first semiconductor layers 106. In some embodiments, the stack of semiconductor layers 104 includes three first semiconductor layers 106. In some embodiments, the stack of semiconductor layers 104 includes four first semiconductor layers 106.

Figure 2:
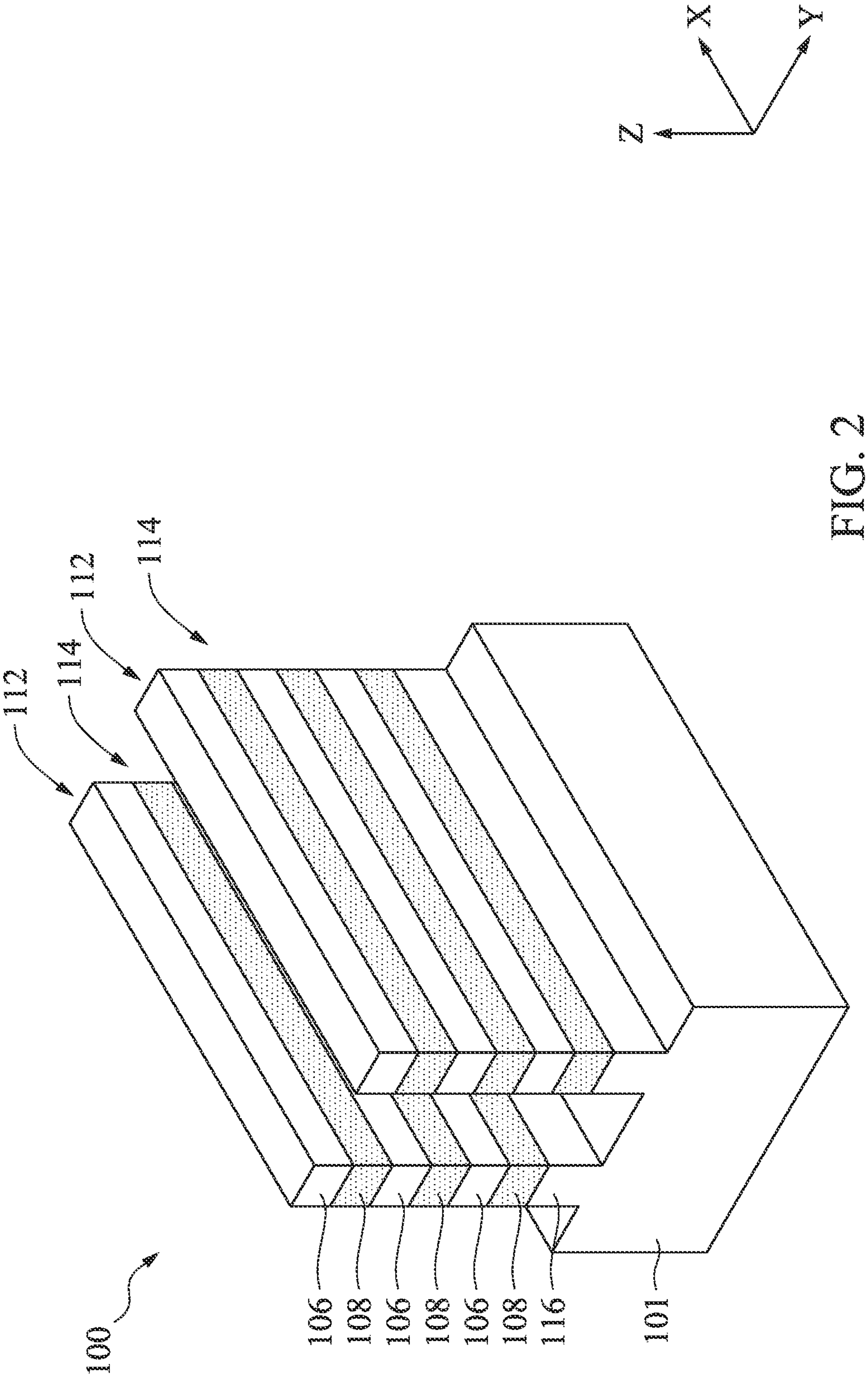

As shown in FIG. 2, fin structures 112 are formed from the stack of semiconductor layers 104. Each fin structure 112 has an upper portion including the semiconductor layers 106, 108 and a well portion 116 formed from the substrate 101. The fin structures 112 may be formed by patterning a hard mask layer (not shown) formed on the stack of semiconductor layers 104 using multi-patterning operations including photo-lithography and etching processes. The etching process can include dry etching, wet etching, reactive ion etching (RIE), and/or other suitable processes. The photo-lithography process may include forming a photoresist layer (not shown) over the hard mask layer, exposing the photoresist layer to a pattern, performing post-exposure bake processes, and developing the photoresist layer to form a masking element including the photoresist layer. In some embodiments, patterning the photoresist layer to form the masking element may be performed using an electron beam (e-beam) lithography process. The etching process forms trenches 114 in unprotected regions through the hard mask layer, through the stack of semiconductor layers 104, and into the substrate 101, thereby leaving the plurality of extending fin structures 112. The trenches 114 extend along the X direction. The trenches 114 may be etched using a dry etch (e.g., RIE), a wet etch, and/or combination thereof.

Figure 3:
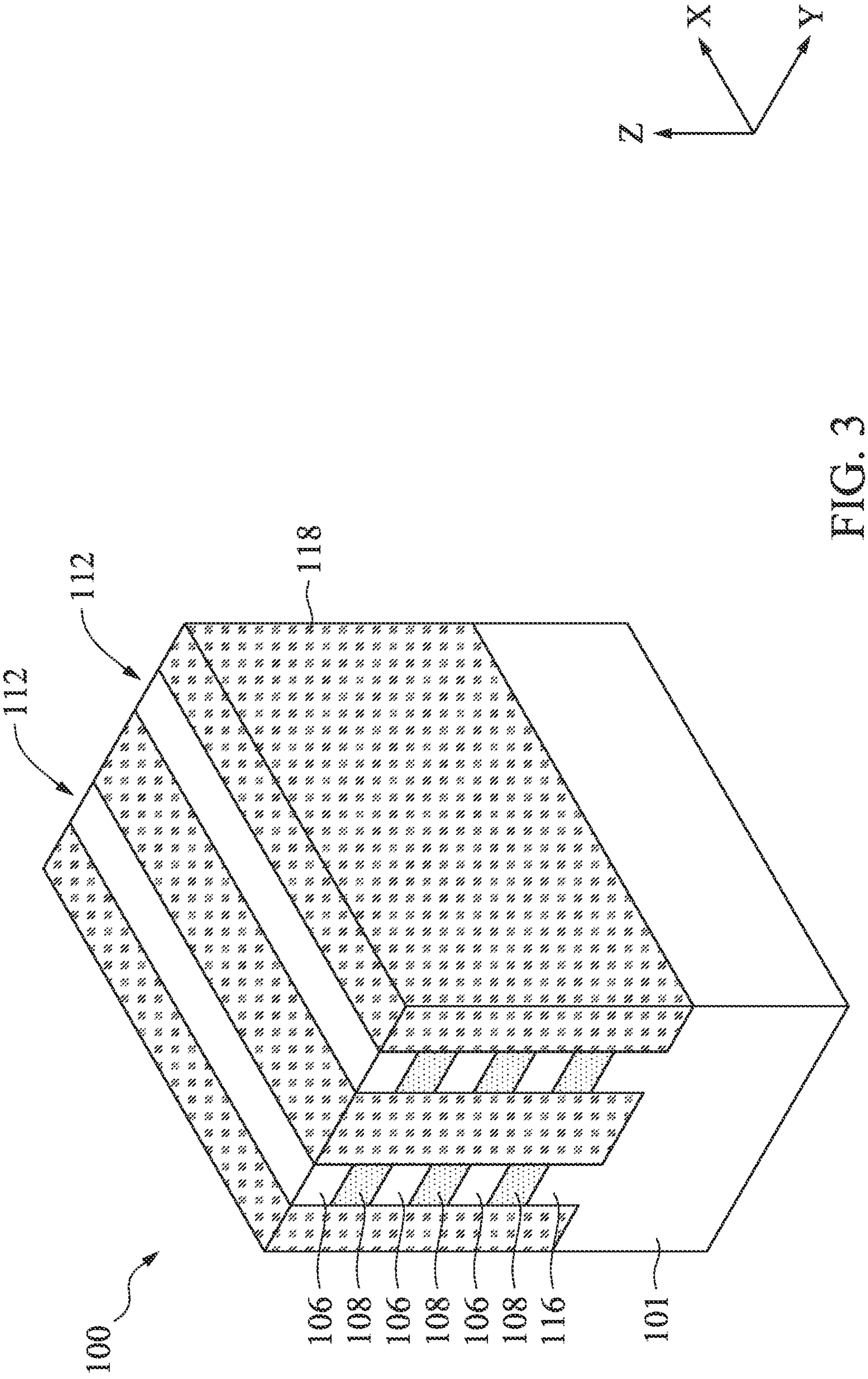

As shown in FIG. 3, after the fin structures 112 are formed, an insulating material 118 is formed on the substrate 101. The insulating material 118 fills the trenches 114 between neighboring fin structures 112 until the fin structures 112 are embedded in the insulating material 118. Then, a planarization operation, such as a chemical mechanical polishing (CMP) method and/or an etch-back method, is performed such that the top of the fin structures 112 is exposed. The insulating material 118 may be made of silicon oxide, silicon nitride, silicon oxynitride (SiON), SiOCN, SiCN, fluorine-doped silicate glass (FSG), a low-K dielectric material, or any suitable dielectric material. The insulating material 118 may be formed by any suitable method, such as low-pressure chemical vapor deposition (LPCVD), plasma enhanced CVD (PECVD) or flowable CVD (FCVD).

Figure 4:
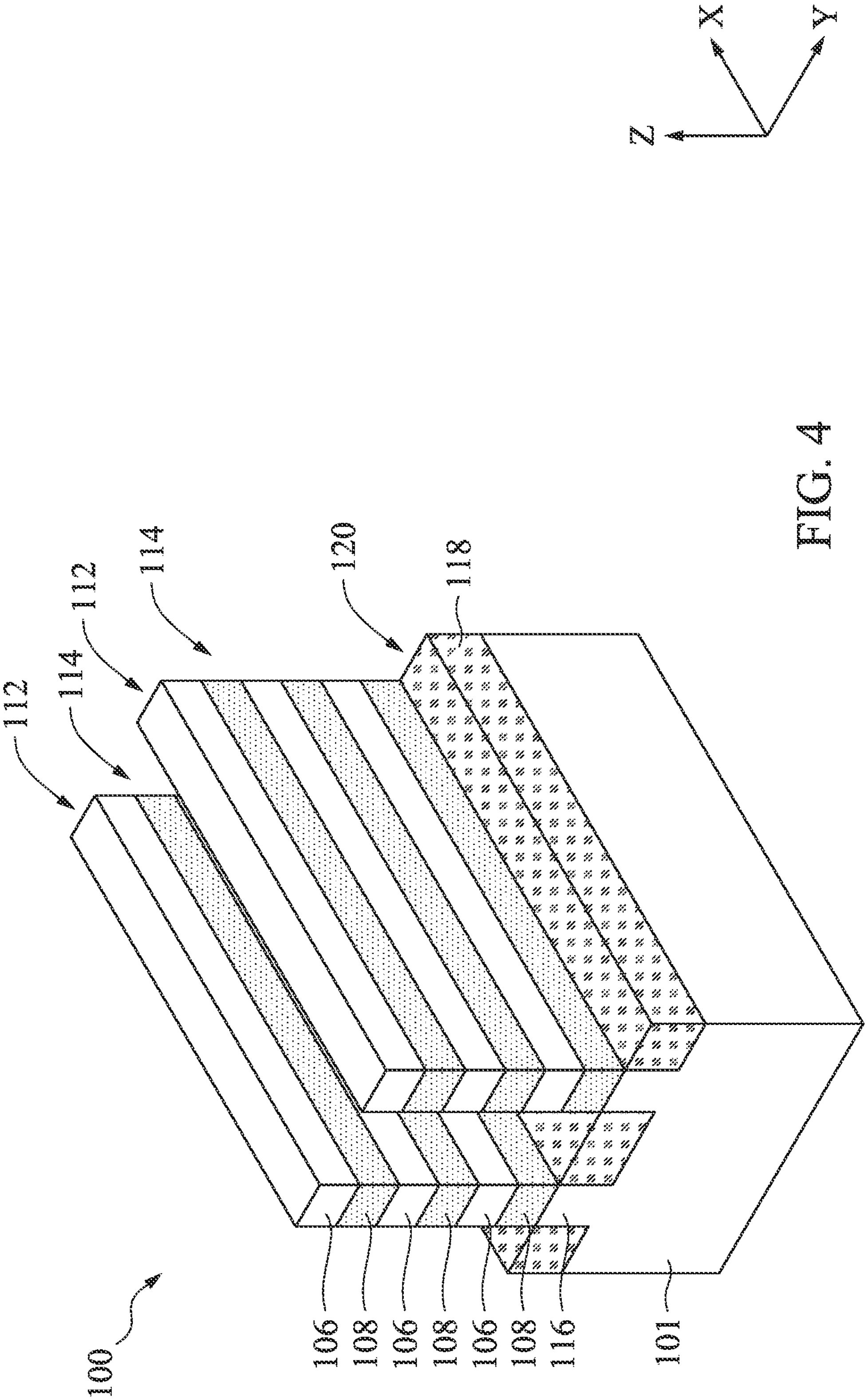

As shown in FIG. 4, the insulating material 118 is recessed to form isolation regions 120. The recess of the insulating material 118 exposes portions of the fin structures 112, such as the stack of semiconductor layers 104. The recess of the insulating material 118 reveals the trenches 114 between the neighboring fin structures 112. The isolation regions 120 may be formed using a suitable process, such as a dry etching process, a wet etching process, or a combination thereof. A top surface of the insulating material 118 may be level with or below a surface of the second semiconductor layers 108 in contact with the well portion 116 formed from the substrate 101. In some embodiments, the isolation regions 120 are the shallow trench isolation (STI) regions.

Figure 5:
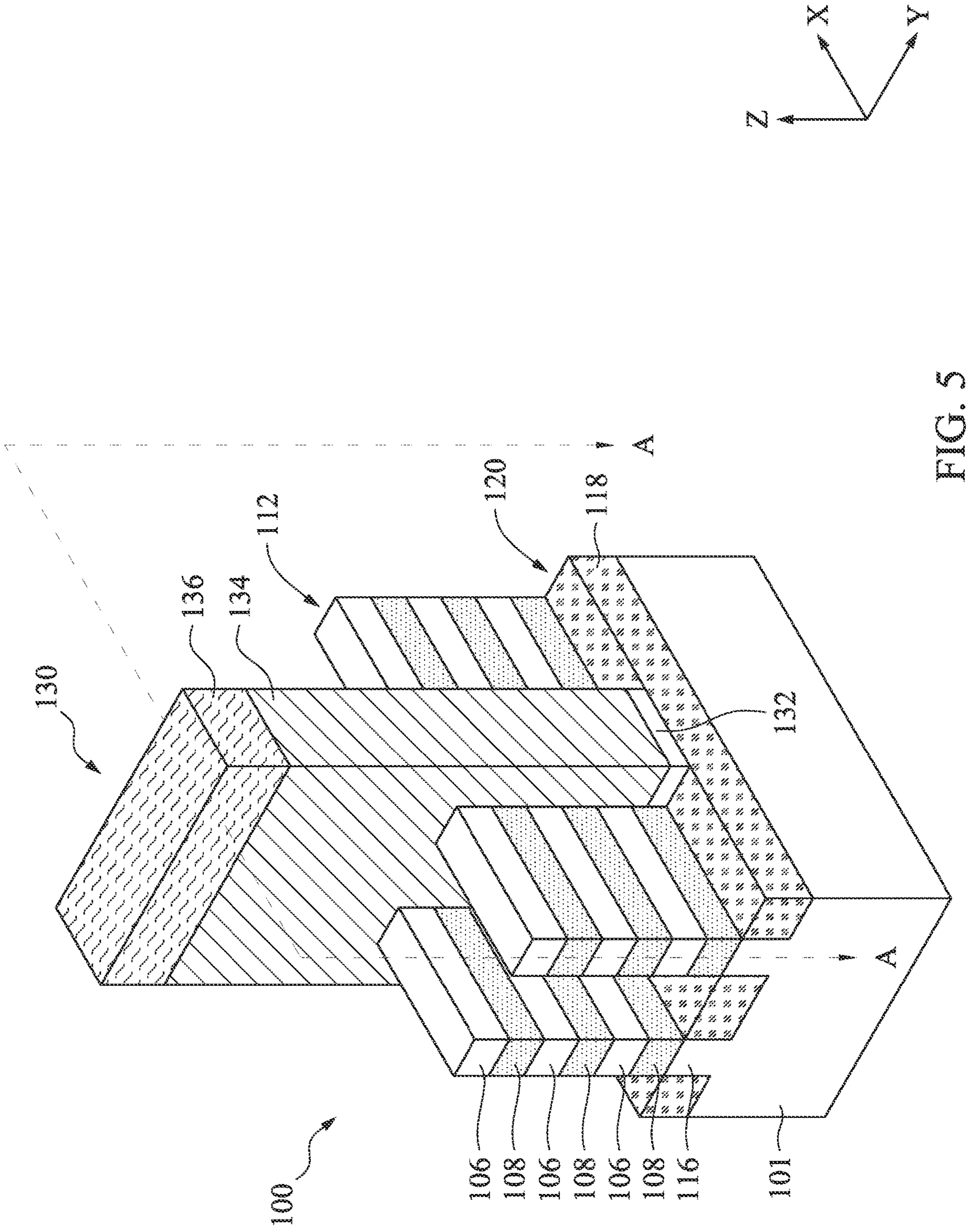

As shown in FIG. 5, one or more sacrificial gate structures 130 (only one is shown) are formed over the semiconductor device structure 100. The sacrificial gate structures 130 are formed over a portion of the fin structures 112. Each sacrificial gate structure 130 may include a sacrificial gate dielectric layer 132, a sacrificial gate electrode layer 134, and a mask layer 136. The sacrificial gate dielectric layer 132, the sacrificial gate electrode layer 134, and the mask layer 136 may be formed by sequentially depositing blanket layers of the sacrificial gate dielectric layer 132, the sacrificial gate electrode layer 134, and the mask layer 136, and then patterning those layers into the sacrificial gate structures 130. While one sacrificial gate structure 130 is shown, two or more sacrificial gate structures 130 may be arranged along the X direction in some embodiments.

The sacrificial gate dielectric layer 132 may include one or more layers of dielectric material, such as a silicon oxide-based material. The sacrificial gate electrode layer 134 may include silicon such as polycrystalline silicon or amorphous silicon. The mask layer 136 may include more than one layer, such as an oxide layer and a nitride layer. The portions of the fin structures 112 that are covered by the sacrificial gate electrode layer 134 of the sacrificial gate structure 130 serve as channel regions for the semiconductor device structure 100.

Figure 6:
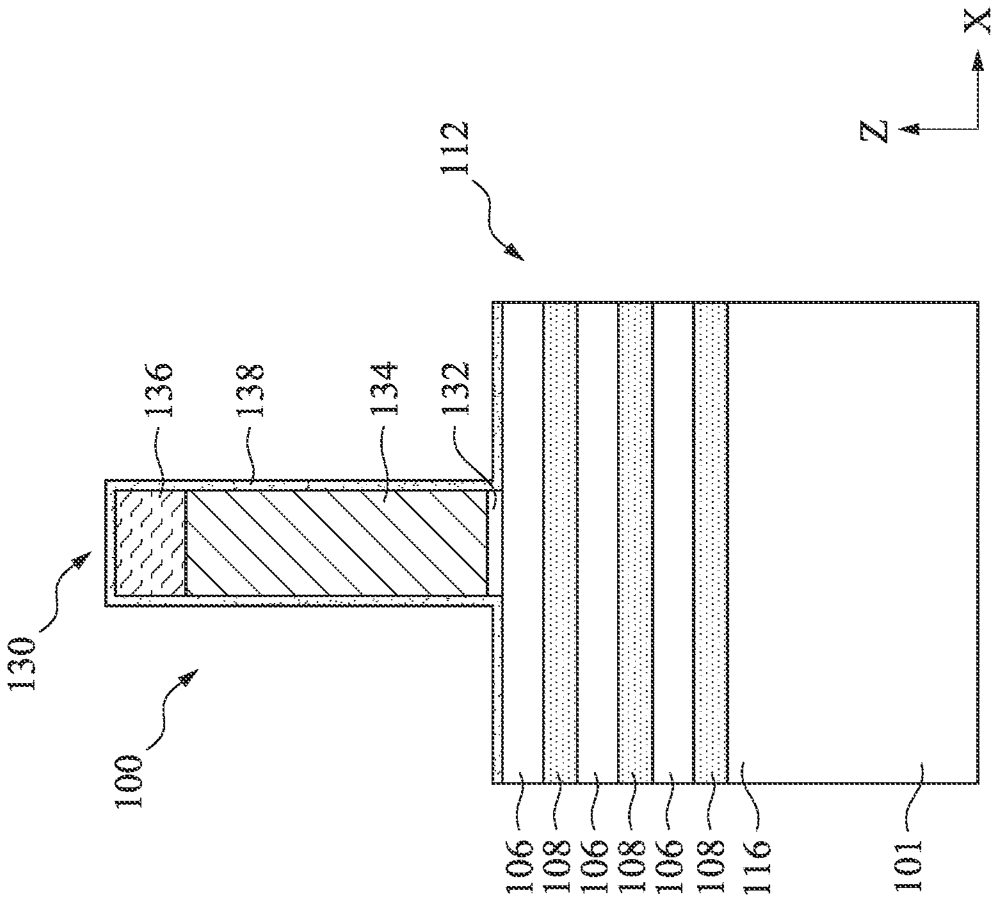
FIGS. 6-20 are cross-sectional side views of various stages of manufacturing the semiconductor device structure taken along line A-A of FIG. 5, in accordance with some embodiments.

FIGS. 6-20 are cross-sectional side views of various stages of manufacturing the semiconductor device structure 100 taken along line A-A of FIG. 5, in accordance with some embodiments. As shown in FIG. 6, a first gate spacer 138 is deposited on the exposed surfaces of the semiconductor device structure 100. For example, the first gate spacer 138 is deposited on the fin structures 112, the isolation regions 120, and the sacrificial gate structure 130. The first gate spacer 138 may be made of a dielectric material such as silicon oxide, silicon nitride, silicon carbide, silicon oxynitride, SiCN, silicon oxycarbide, SiCON, and/or combinations thereof. The first gate spacer 138 may be formed by any suitable process. In some embodiments, the first gate spacer 138 is a conformal layer formed by a conformal process, such as an atomic layer deposition (ALD) process.

Figure 7:
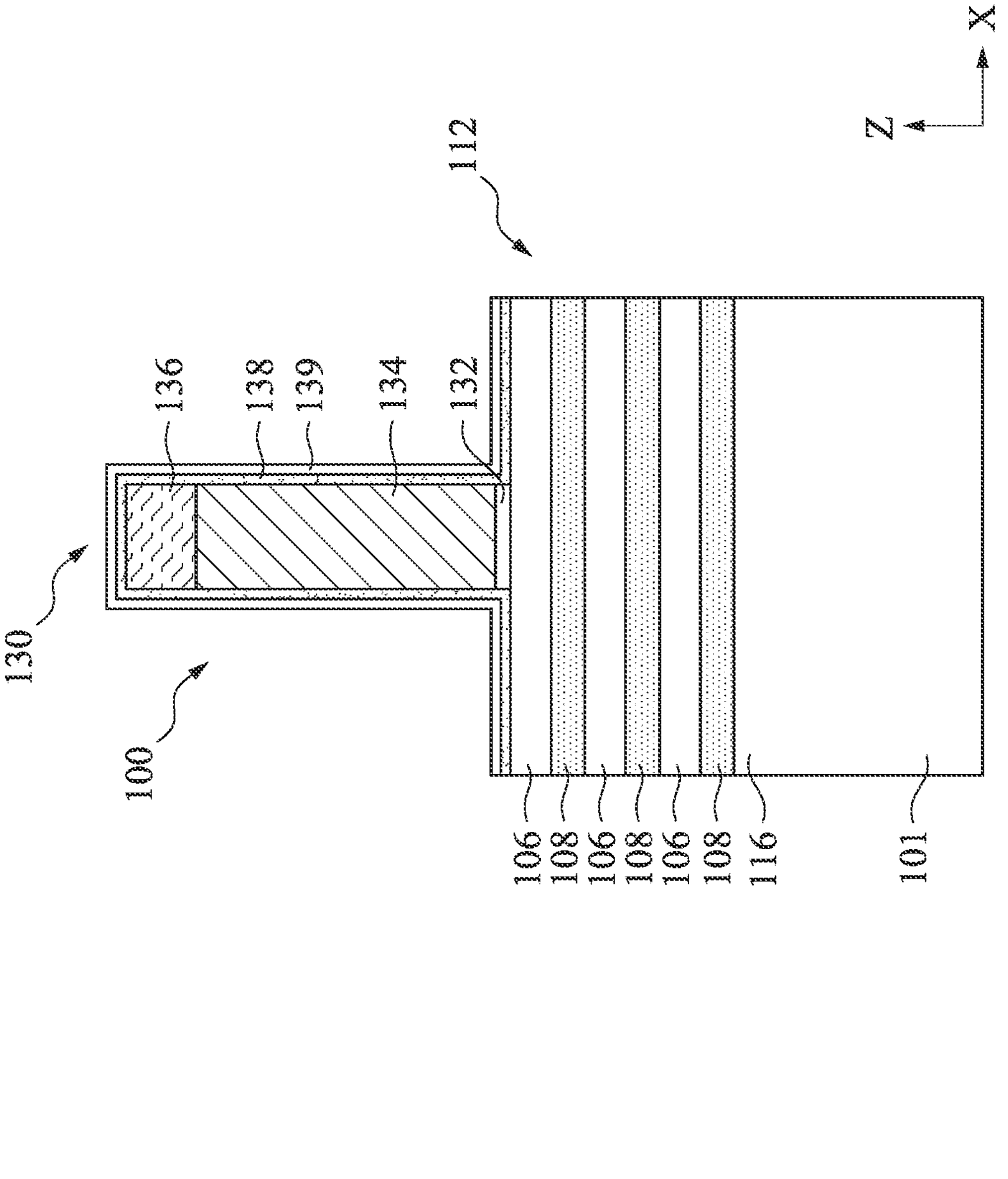

As shown in FIG. 7, a second gate spacer 139 is deposited on the first gate spacer 138. The second gate spacer 139 may include any suitable dielectric material, such as $SiO_x$, SiON, SiN, SiCON, or SiCO. The second gate spacer 139 may have a thickness ranging from about 0.5 nm to about 5 nm. The second gate spacer 139 may be formed by any suitable process. In some embodiments, the second gate spacer 139 is deposited by CVD, PECVD, or electron cyclotron resonance CVD (ECR-CVD).

Figure 8:
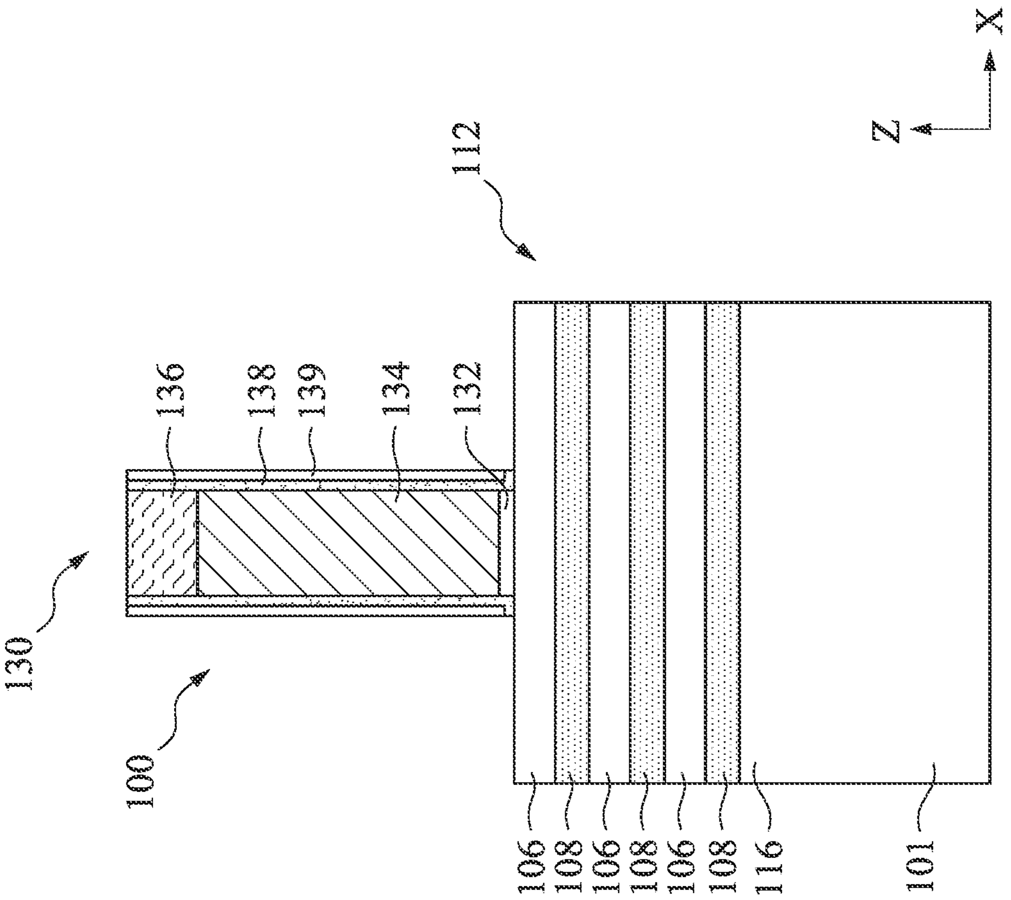

As shown in FIG. 8, horizontal portions of the first and second gate spacers 138, 139 are removed. In some embodiments, the horizontal portions of the first and second gate spacers 138, 139 are removed by an anisotropic etch process. The anisotropic etch process may be a selective etch process that does not substantially affect the mask layer 136, the stack of semiconductor layers 104, and the isolation regions 120.

Figure 9:
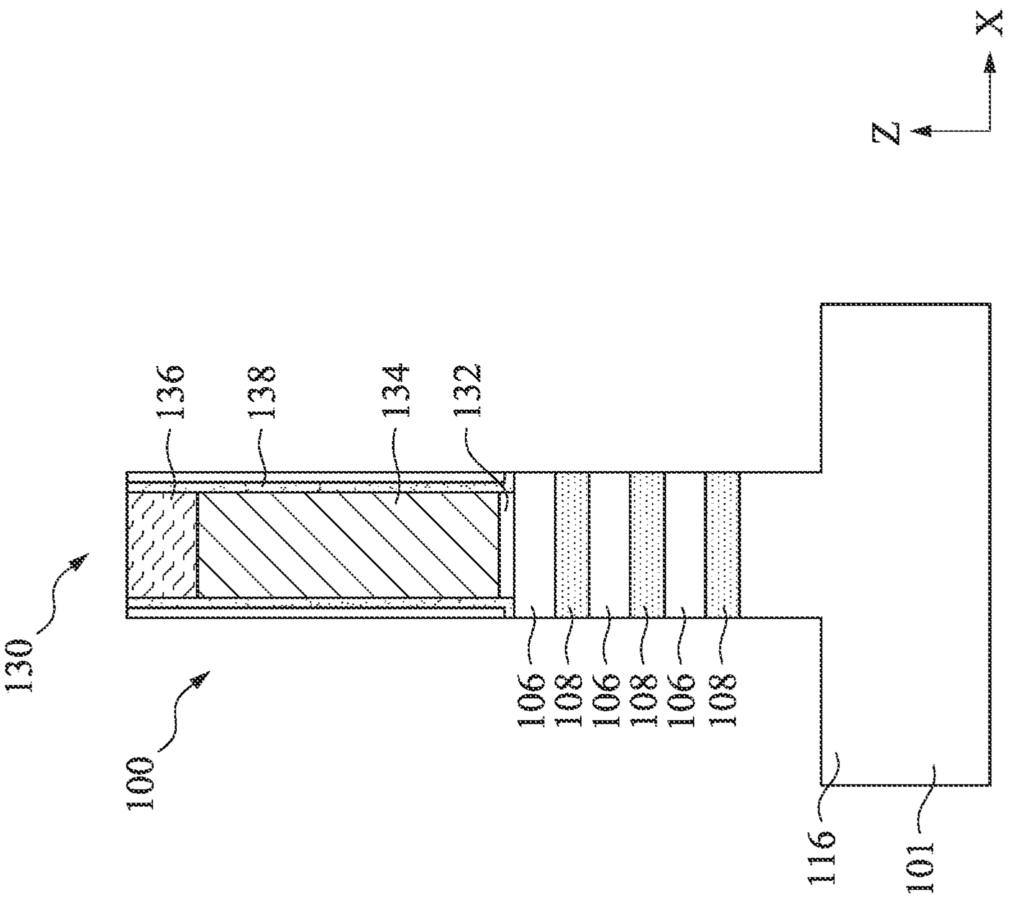

As shown in FIG. 9, the portions of the fin structures 112 not covered by the sacrificial gate structure 130 and the first and second gate spacers 138, 139 are recessed to a level above, at, or below the top surfaces of the isolation regions 120. The recess of the portions of the fin structures 112 can be done by an etch process. The etch process may be a dry etch, such as a RIE, NBE, or the like, or a wet etch, such as using tetramethyalammonium hydroxide (TMAH), ammonium hydroxide ($NH_4OH$), or any suitable etchant. The well portions 116 are exposed on opposite sides of the sacrificial gate structure 130, as shown in FIG. 9.

Figure 10:
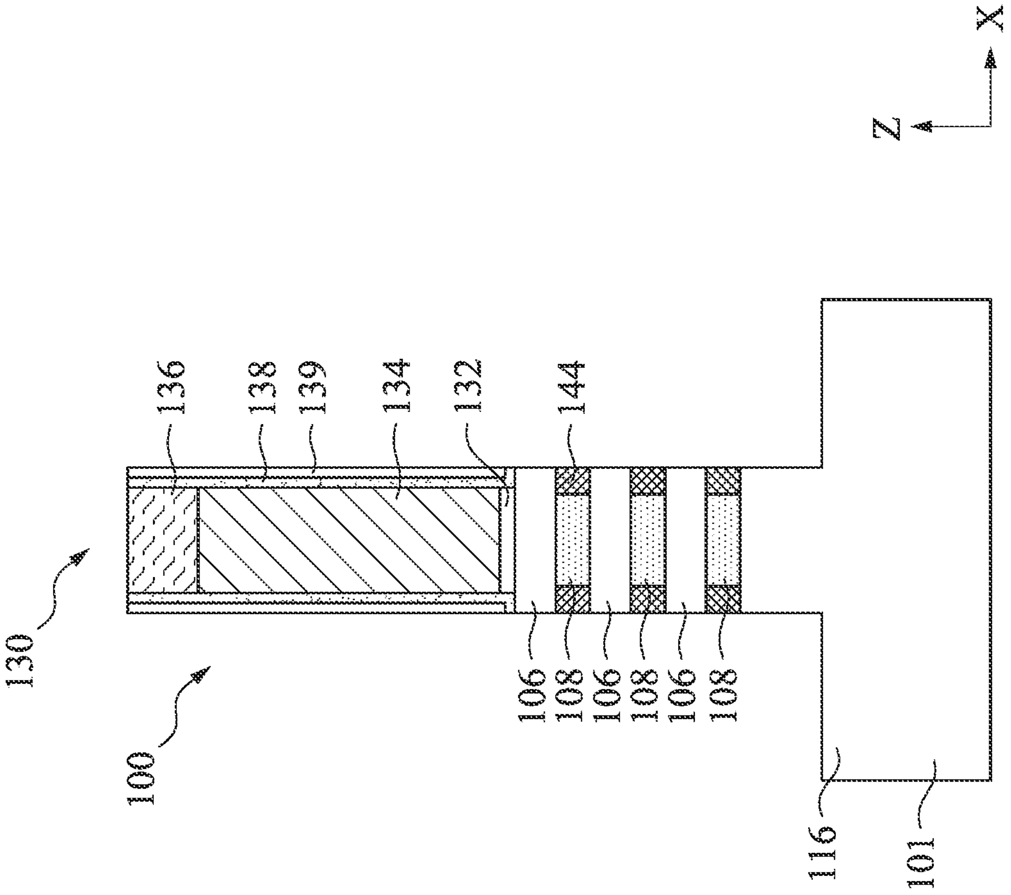

As shown in FIG. 10, edge portions of each second semiconductor layer 108 of the stack of semiconductor layers 104 are removed horizontally along the X direction. The removal of the edge portions of the second semiconductor layers 108 forms cavities. In some embodiments, the portions of the second semiconductor layers 108 are removed by a selective wet etch process. In cases where the second semiconductor layers 108 are made of SiGe and the first semiconductor layers 106 are made of silicon, the second semiconductor layer 108 can be selectively etched using a wet etchant such as, but not limited to, ammonium hydroxide ($NH_4OH$), tetramethylammonium hydroxide (TMAH), ethylenediamine pyrocatechol (EDP), or potassium hydroxide (KOH) solutions.

After removing edge portions of each second semiconductor layers 108, a dielectric layer is deposited in the cavities to form dielectric spacers 144. The dielectric spacers 144 may be made of a low-K dielectric material, such as SiON, SiCN, SiOC, SiOCN, or SiN. The dielectric spacers 144 may be formed by first forming a conformal dielectric layer using a conformal deposition process, such as ALD, followed by an anisotropic etching to remove portions of the conformal dielectric layer other than the dielectric spacers 144. The dielectric spacers 144 are protected by the first semiconductor layers 106 during the anisotropic etching process. The remaining second semiconductor layers 108 are capped between the dielectric spacers 144 along the X direction.

Figure 11:
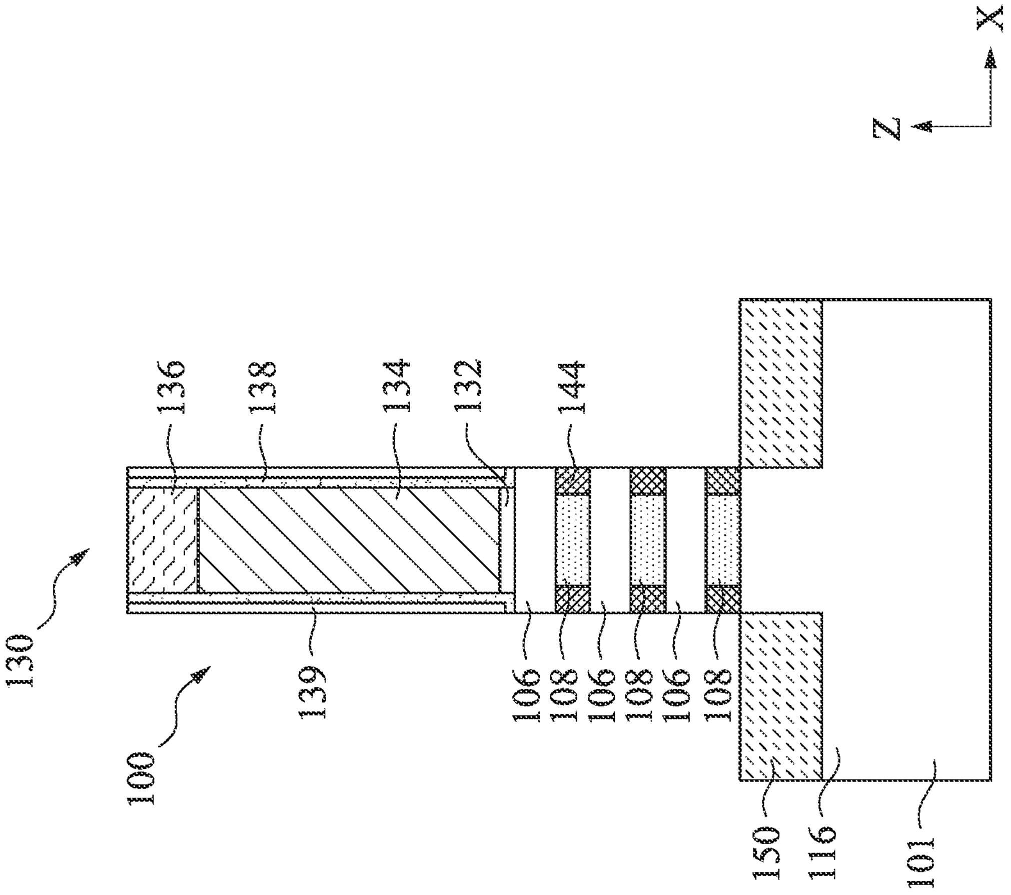

As shown in FIG. 11, a first semiconductor material 150 is formed on the exposed well portions 116. In some embodiments, the first semiconductor material 150 includes undoped silicon or undoped SiGe. The first semiconductor material 150 may be first formed on semiconductor surfaces, such as on the exposed well portions 116 and on the first semiconductor layers 106, by epitaxy. A subsequent etch process is performed to remove the portions of the first semiconductor material 150 formed on the first semiconductor layers 106. The first semiconductor material 150 formed on the exposed well portions 116 may form a concave top surface as the result of the etch process. In some embodiments, the first semiconductor material 150 has a thickness ranging from about 5 nm to about 50 nm along the Z direction.

Figure 12:
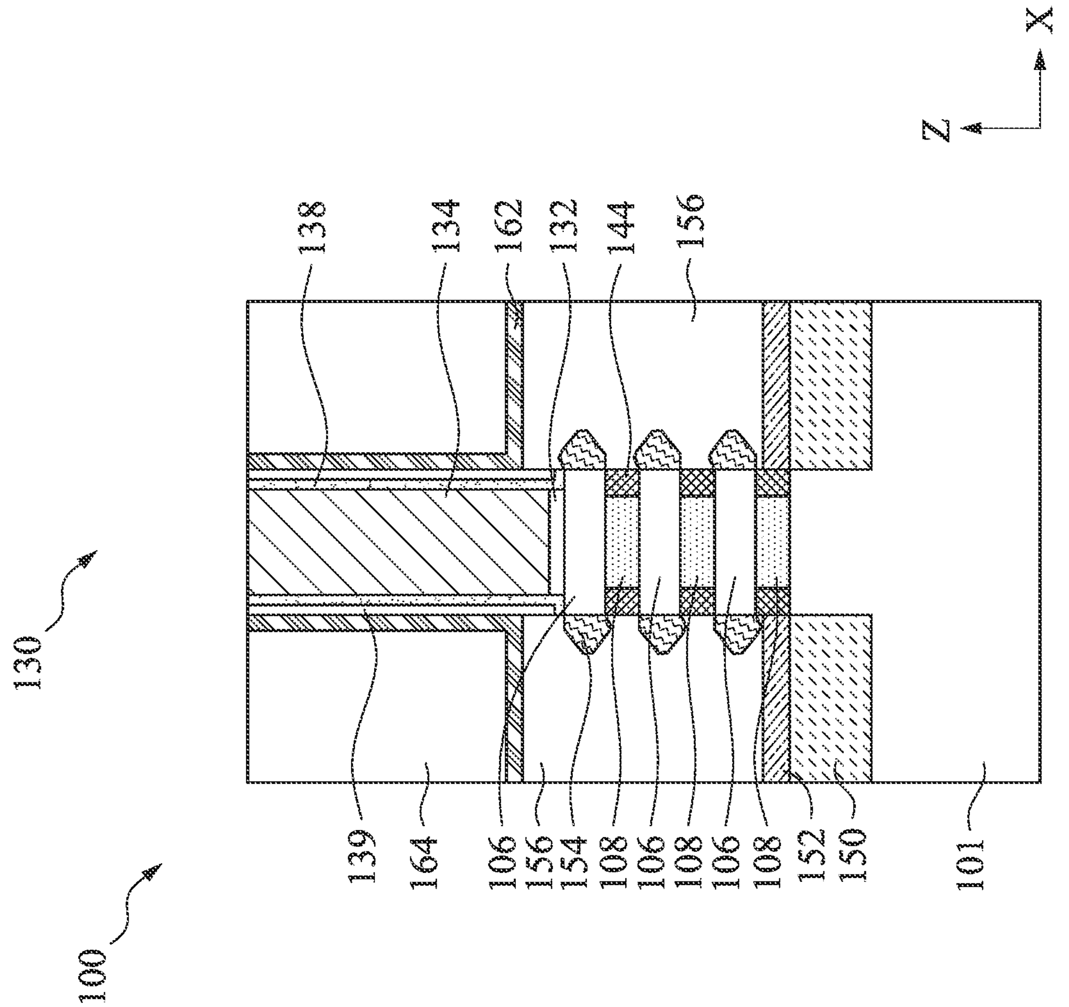

Next, as shown in FIG. 12, a dielectric layer 152 is formed on the first semiconductor material 150. The dielectric layer 152 may be formed by first forming a dielectric layer on the exposed surfaces of the semiconductor device structure 100, followed by one or more etch processes to remove portions of the dielectric layer other than the dielectric layer 152. A mask layer (not shown), such as a bottom anti-reflective coating (BARC) layer, may be used to assist with the removal of the portions of the dielectric layer. The dielectric layer 152 may include any suitable dielectric material. In some embodiments, the dielectric layer 152 includes SiN. The dielectric layer 152 may be formed by any suitable process. In some embodiments, the dielectric layer 152 is formed by CVD. Next, a second semiconductor material 154 is formed from the first semiconductor layers 106. The second semiconductor material 154 may be made of one or more layers of Si, SiP, SiC, SiAs, SiSb, and SiCP for n-channel FETs or Si, SiGe, Ge for p-channel FETs. For p-channel FETs, p-type dopants, such as boron (B), may be included in the second semiconductor material 154. For n-channel FETs, n-type dopants, such as phosphorus (P) or arsenic (As), may be included in the second semiconductor material 154. In some embodiments, the dopant concentration of the second semiconductor material 154 may range from about $1\times10^{19}$ cm$^{-3}$ to about $2\times10^{21}$ cm$^{-3}$. The second semiconductor material 154 may be formed by an epitaxial growth method using CVD, ALD or MBE. As shown in FIG. 12, in some embodiments, the second semiconductor material 154 is selectively formed on semiconductor materials, such as the first semiconductor layers 106, and is not formed on dielectric materials, such as the dielectric layer 152 and the dielectric spacers 144. In some embodiments, the second semiconductor material 154 includes facets, which may correspond to crystalline planes of the material used for the first semiconductor layers 106.

Next, as shown in FIG. 12, a third semiconductor material 156 is formed from the second semiconductor material 154. The third semiconductor material 156 may be formed by an epitaxial growth method using CVD, ALD or MBE. The third semiconductor material 156 may be made of one or more layers of Si, SiP, SiC and SiCP for n-type FETs or Si, SiGe, Ge for p-type FETs. For p-type FETs, p-type dopants, such as boron (B), may be included in the second semiconductor material 154. For n-type FETs, n-type dopants, such as phosphorus (P) or arsenic (As), may be included in the third semiconductor material 156. In some embodiments, the second semiconductor material 154 and the third semiconductor material 156 may include the same semiconductor materials but with different dopant concentrations. The dopant concentration of the third semiconductor material 156 may be substantially greater than the dopant concentration of the second semiconductor material 154. In some embodiments, the dopant concentration of the third semiconductor material 156 may range from about $5\times10^{19}$ cm$^{-3}$ to about $4\times10^{21}$ cm$^{-3}$. The third semiconductor material 156 may be epitaxially grown from the second semiconductor material 154. The quality of the third semiconductor material 156 may be improved due to the facets of the second semiconductor material 154. In some embodiments, voids may be formed near the top of the third semiconductor material 156 as a result of growing the third semiconductor material 156 from the second semiconductor material 154. In some embodiments, the dielectric layer 152 is not present, and the third semiconductor material 156 is grown from the first semiconductor material 150 and the second semiconductor material 154, which leads to a void-free third semiconductor material 156.

In some embodiments, a cap layer (not shown) may be formed on the third semiconductor material 156. The cap layer may include a semiconductor material. In some embodiments, the cap layer includes the same material as the third semiconductor material. The cap layer may be epitaxially grown from the third semiconductor material 156.

In some embodiments, the second and third semiconductor materials 154, 156 may be in-situ doped during growth. If the dopant concentrations of the second and third semiconductor materials 154, 156 are greater than the above-mentioned respective ranges, the quality of the second and third semiconductor material 154, 156 may be negatively affected. Thus, subsequent processes may be performed to increase the dopant concentration and/or dopant activation in order to decrease electrical contact resistance.

The second semiconductor material 154 and the third semiconductor material 156 together may be the source/drain (S/D) region. In this disclosure, a source region and a drain region are interchangeably used, and the structures thereof are substantially the same. Furthermore, source/drain region(s) may refer to a source or a drain, individually or collectively dependent upon the context. In some embodiments, p-type S/D regions and n-type S/D regions may be formed separately using one or more mask layers. In some embodiments, the second semiconductor material 154 and the third semiconductor material 156 are crystalline semiconductor materials.

Next, as shown in FIG. 12, a contact etch stop layer (CESL) 162 is conformally formed on the exposed surfaces of the semiconductor device structure 100. The CESL 162 covers the second gate spacer 139, the isolation regions 120, and the third semiconductor material 156 (or the cap layer if present). The CESL 162 may include an oxygen-containing material or a nitrogen-containing material, such as silicon nitride, silicon carbon nitride, silicon oxynitride, carbon nitride, silicon oxide, silicon carbon oxide, or the like, or a combination thereof, and may be formed by CVD, PECVD, ALD, or any suitable deposition technique. In some embodiments, the CESL 162 is a single layer, as shown in FIG. 12. In some embodiments, the CESL 162 includes two or more layers. Next, an interlayer dielectric (ILD) layer 164 is formed on the CESL 162. The materials for the ILD layer 164 may include compounds including Si, O, C, and/or H, such as silicon oxide, SiCOH, or SiOC. Organic materials, such as polymers, may also be used for the ILD layer 164. The ILD layer 164 may be deposited by a PECVD process or other suitable deposition technique. In some embodiments, after formation of the ILD layer 164, the semiconductor device structure 100 may be subject to a thermal process to anneal the ILD layer 164.

After the ILD layer 164 is formed, a planarization operation, such as CMP, is performed on the semiconductor device structure 100 until the sacrificial gate electrode layer 134 is exposed, as shown in FIG. 12.

Figure 13:
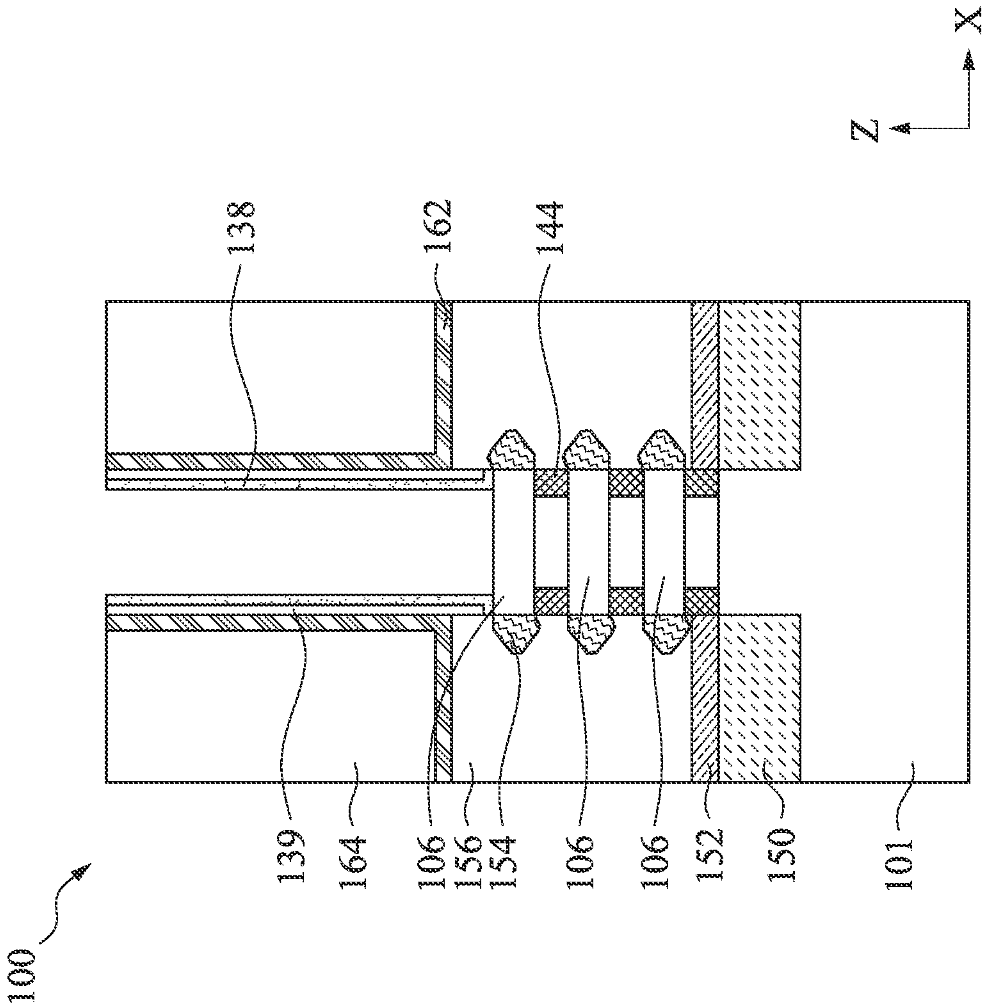

Next, as shown in FIG. 13, the sacrificial gate structure 130 and the second semiconductor layers 108 are removed. The removal of the sacrificial gate structure 130 and the semiconductor layers 108 forms an opening between the first gate spacers 138 and between the first semiconductor layers 106. The ILD layer 164 protects the second semiconductor material 156 during the removal processes. The sacrificial gate structure 130 can be removed using plasma dry etching and/or wet etching. The sacrificial gate electrode layer 134 may be first removed by any suitable process, such as dry etch, wet etch, or a combination thereof, followed by the removal of the sacrificial gate dielectric layer 132, which may also be performed by any suitable process, such as dry etch, wet etch, or a combination thereof. In some embodiments, a wet etchant such as a tetramethylammonium hydroxide (TMAH) solution can be used to selectively remove the sacrificial gate electrode layer 134 but not the first gate spacers 138, the ILD layer 164, and the CESL 162.

The second semiconductor layers 108 may be removed using a selective wet etching process. In cases where the second semiconductor layers 108 are made of SiGe and the first semiconductor layers 106 are made of Si, the chemistry used in the selective wet etching process removes the SiGe while not substantially affecting Si, the dielectric materials of the first gate spacers 138, and the dielectric spacers 144. In one embodiment, the second semiconductor layers 108 can be removed using a wet etchant such as, but not limited to, hydrofluoric (HF), nitric acid ($HNO_3$), hydrochloric acid (HCl), or phosphoric acid ($H_3PO_4$).

Figure 14:
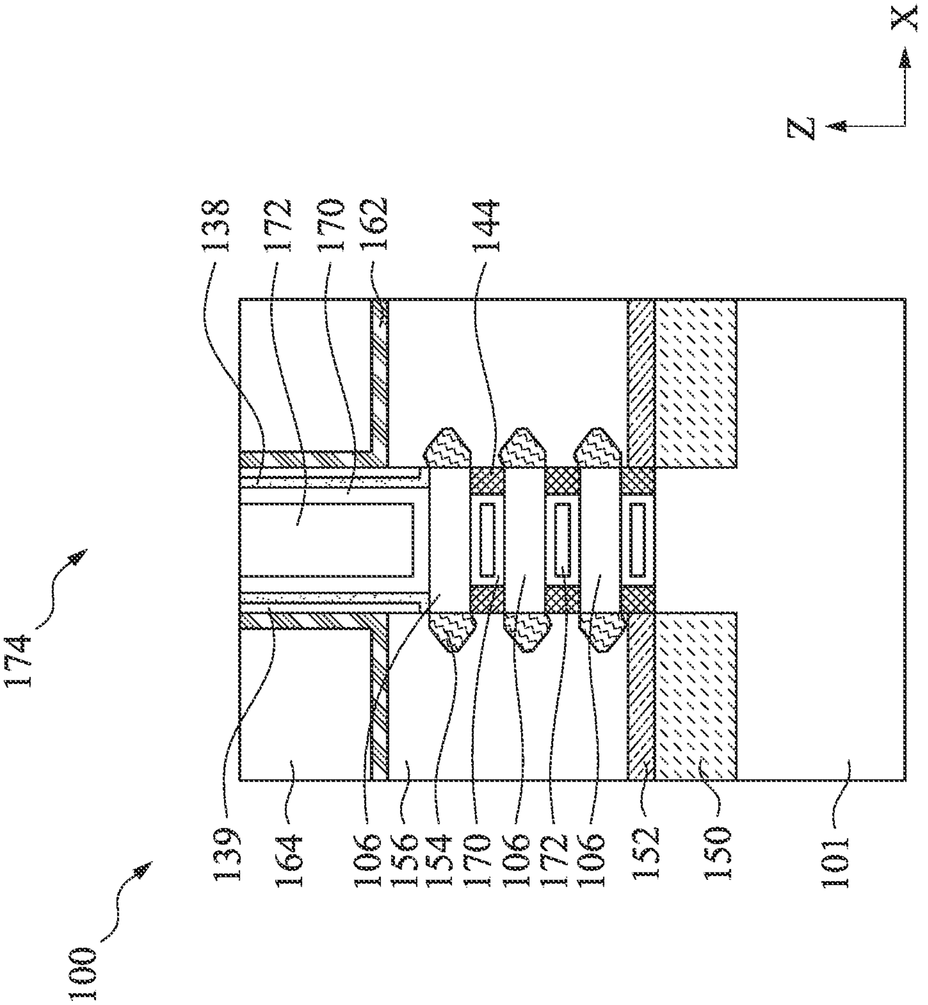

As shown in FIG. 14, after the formation of the nanostructure channels (i.e., the exposed portions of the first semiconductor layers 106), a gate dielectric layer 170 is formed to surround the exposed portions of the first semiconductor layers 106, and a gate electrode layer 172 is formed on the gate dielectric layer 170. The gate dielectric layer 170 and the gate electrode layer 172 may be collectively referred to as a gate structure 174. In some embodiments, an interfacial layer (IL) (not shown) is formed between the gate dielectric layer 170 and the exposed surfaces of the first semiconductor layers 106, and one or more work function layers (not shown) are formed between the gate dielectric layer 170 and the gate electrode layer 172. In some embodiments, the gate dielectric layer 170 includes one or more layers of a dielectric material, such as silicon oxide, silicon nitride, or high-K dielectric material, other suitable dielectric material, and/or combinations thereof. Examples of high-K dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-K dielectric materials, and/or combinations thereof. The gate dielectric layer 170 may be formed by CVD, ALD or any suitable deposition technique. The work function layer may include polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, or other suitable materials. The gate electrode layer 172 may include one or more layers of conductive material, such as platinum (Pt), palladium (Pd), tantalum (Ta), ytterbium (Yb), aluminum (Al), silver (Ag), titanium (Ti), ruthenium (Ru), molybdenum (Mo), chromium (Cr), tungsten (W), copper (Cu), or similar material, and/or any combinations thereof. The gate electrode layer 172 may be formed by CVD, ALD, electro-plating, or other suitable deposition technique. The gate electrode layer 172 may also be deposited over the upper surface of the ILD layer 164. The gate dielectric layer 170 and the gate electrode layer 172 formed over the ILD layer 164 are then removed by using, for example, CMP, until the top surface of the ILD layer 164 is exposed.

It is understood that the semiconductor device structure 100 may undergo further processes, such as cut metal gate (CMG) process and/or continuous poly on diffusion edge (CPODE) process. The CMG process separates the gate electrode layer 172 into multiple segments that can be individually controlled. The CPODE process forms isolation between devices.

Figure 15:
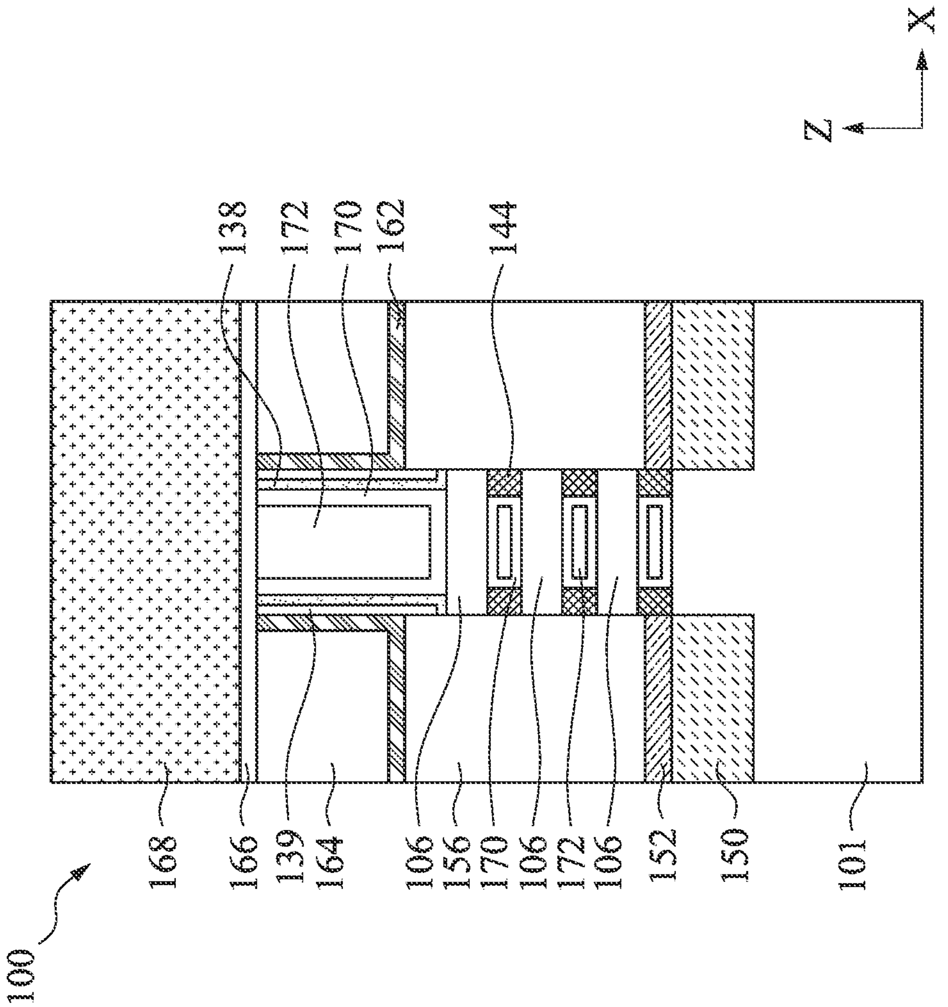

As shown in FIG. 15, an etch stop layer 166 and a second ILD layer 168 are formed over the ILD layer 164 and the gate electrode layer 172. The etch stop layer 166 may include the same material as the CESL 162 and may be formed by the same process as the CESL 162. The second ILD layer 168 may include the same material as the ILD layer 164 and may be formed by the same process as the ILD layer 164.

Figure 16:
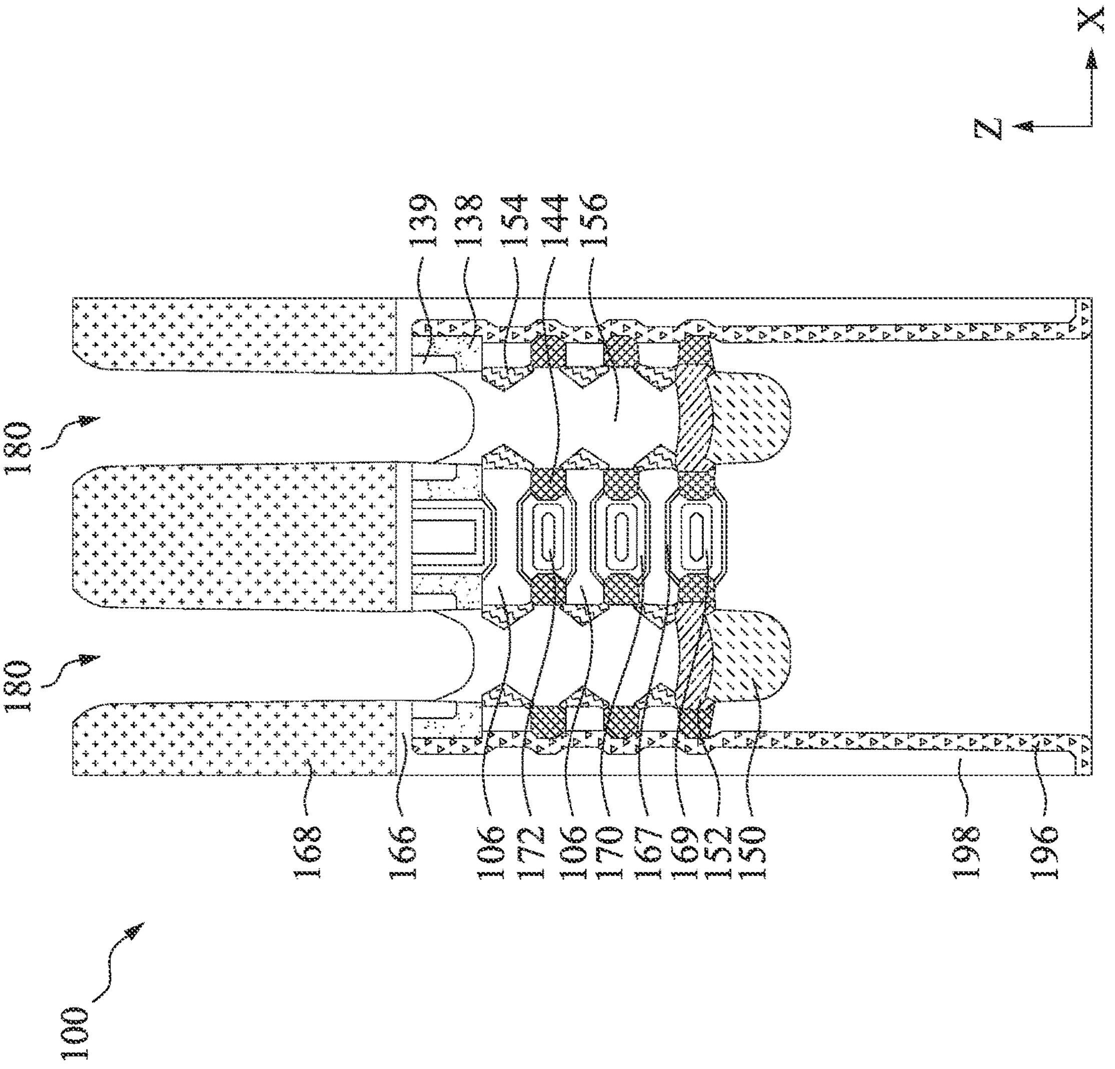

Next, as shown in FIG. 16, openings 180 are formed in the second ILD layer 168, the etch stop layer 166, the ILD layer 164, and the CESL 162 to expose the third semiconductor material 156. In some embodiments, portions of the ILD layer 164 and the CESL 162 located over the third semiconductor material 156 may be removed. In some embodiments, the cap layer (not shown) and a portion of the third semiconductor material 156 may be also removed. The openings 180 may be formed by an etch process, such as a dry etch process, a wet etch process, or a combination thereof. A patterned mask (not shown) may be formed over the second ILD layer 168, and the pattern of the patterned mask is transferred to the second ILD layer 168, the etch stop layer 166, the ILD layer 164, and the CESL 162.

As shown in FIG. 16, the semiconductor device structure 100 includes an IL 167 formed on the first semiconductor layers 106 and a work function layer 169 formed between the gate dielectric layer 170 and the gate electrode layer 172. In addition, the semiconductor device structure 100 includes a dielectric liner 196 and a dielectric material 198. The dielectric liner 196 and the dielectric material 198 may be an isolation structure formed by a CPODE process. In some embodiments, the dielectric material 198 include the same material as the etch stop layer 166.

Figure 17:
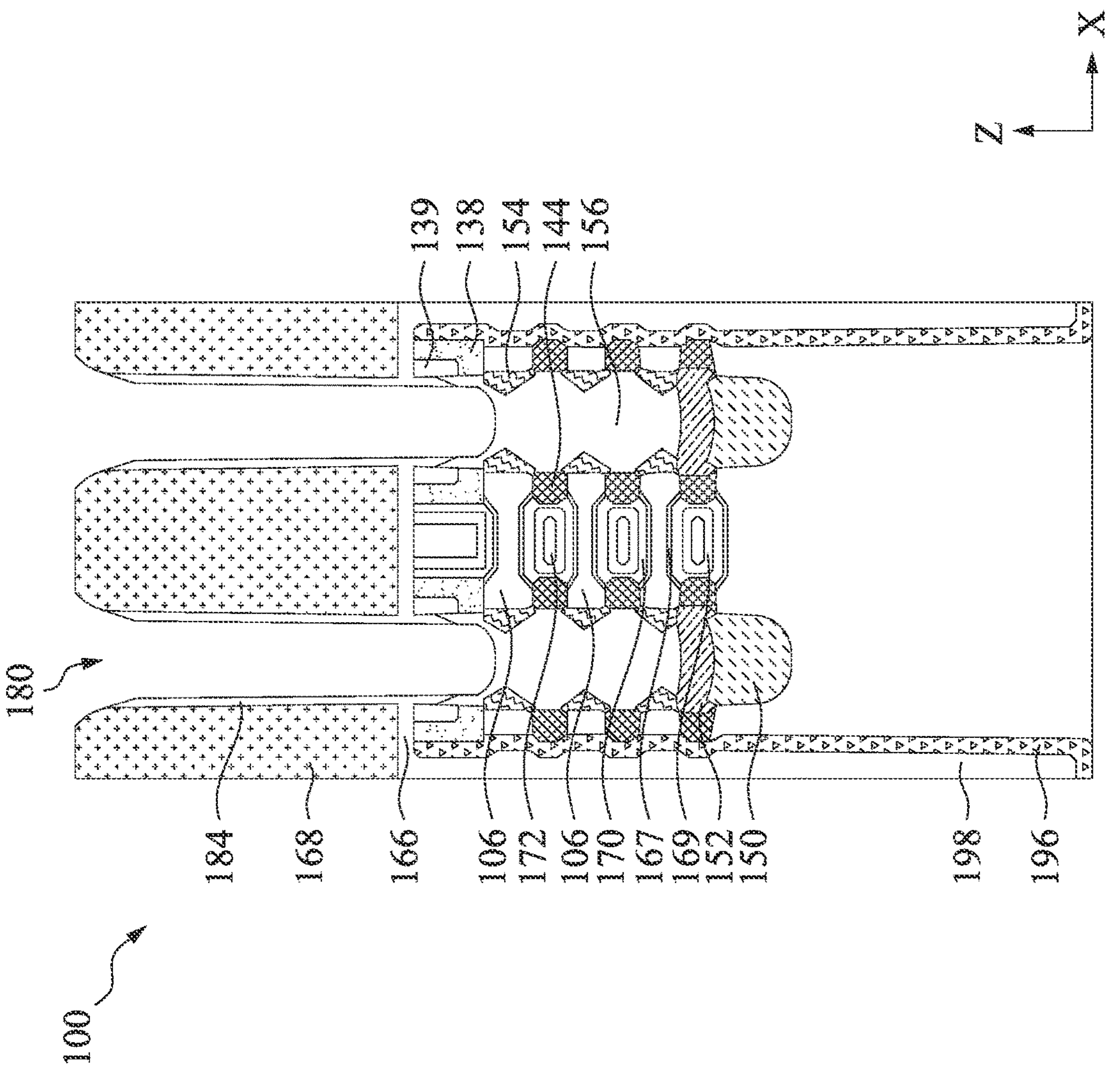

As shown in FIG. 17, a liner 184 is formed on the vertical surfaces of the second ILD layer 168, the etch stop layer 166, and the first gate spacer 138. The liner 184 may include any suitable material. In some embodiments, the liner 184 is a nitride layer, such as a silicon nitride layer. In some embodiments, the liner 84 includes the same material as the etch stop layer 166. The liner 184 may be formed by first forming a dielectric layer on the exposed surfaces of the semiconductor device structure 100, followed by an anisotropic etch process to remove portions of the dielectric layer formed on horizontal surfaces of the semiconductor device structure 100. For example, portions of the dielectric layer formed on the second ILD layer 168 and the third semiconductor material 156 are removed by the anisotropic etch process. The liner 184 protects the second ILD layer 168 during the subsequent processes.

Figure 18:
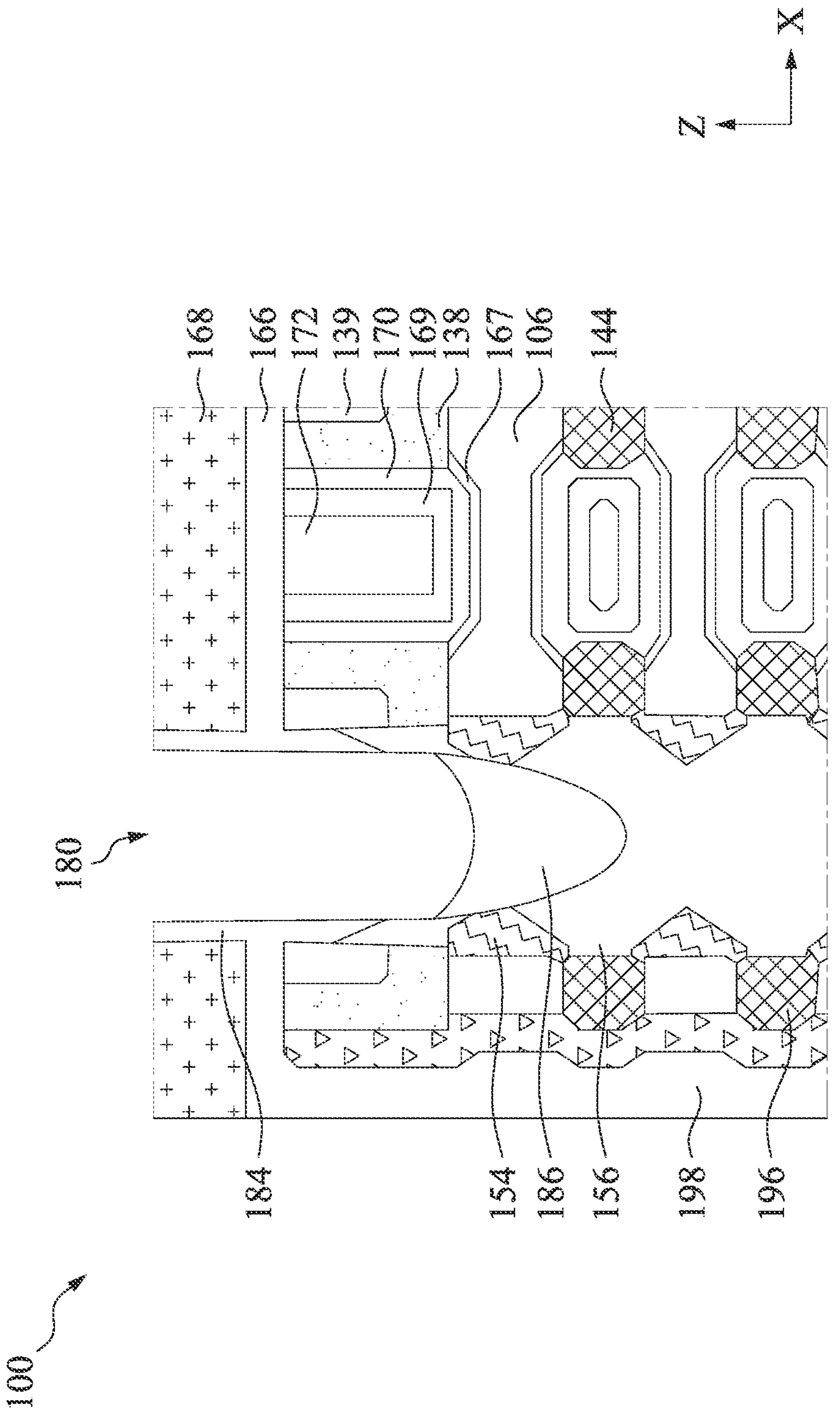

As described above, in order to reduce the electrical contact resistance, one or more processes may be performed to increase dopant concentration and/or dopant activation in the third semiconductor material 156 and/or the second semiconductor material 154. In some embodiments, a SPER process is performed on the second and/or third semiconductor material 154, 156. The SPER process may include an amorphization process and an annealing process. In some embodiments, a portion of the third semiconductor material 156, which is a crystalline semiconductor material, is amorphized by the amorphization process. For example, impurities may be injected into the third semiconductor material 156 to form an amorphous region 186, as shown in FIG. 18. In some examples, the amorphous region 186 may extend to the dielectric layer 152. However, such large amorphous region 186 may take a long period of time to be recrystallized. Thus, in some embodiments, the amorphous region 186 extends to a level between the topmost first semiconductor layer 106 and the adjacent first semiconductor layer 106 below the topmost first semiconductor layer 106. As a result, the duration of the annealing process to recrystallize the amorphous region 186 is reduced.

In some embodiments, the amorphization process is an ion implantation process which introduces first species into the exposed third semiconductor material 156, such that at least a top portion of the third semiconductor material 156 is converted into an amorphous structure (i.e., the amorphous region 186). The first species of the ion implantation process may be a group IV element, such as C, Si, Ge; a group III element, such as B, Al, Ga, In; a group V element, such as P, As, Sb, or a group VIII element, such as He, Ar, Xe. The implantation process may have an implantation energy ranging from about 0.3 keV to about 60 keV, a dosage greater than about $1\times10^{13}$ $cm^{-2}$, and a processing temperature ranging from about −150 degrees Celsius to about 500 degrees Celsius.

In some embodiments, a dopant implantation process may be performed to introduce a second species (e.g., dopants) into the third semiconductor material 156. In some embodiments, the dopant implantation process is performed after the amorphization process. For p-type FETs, the second species may include B, A. Ga, or In. For n-type FETs, the second species may include As, P, or Sb. In an example embodiment, the second species (e.g., B or As) is implanted using an energy in a range between about 0.3 keV and about 20 keV, with a dosage in a range from about $1\times10^{12}$ $cm^{-2}$ to about $1\times10^{17}$ $cm^{-2}$. The dopant implantation process may further include an implantation tilt angle ranging from about 0 degrees to about 15 degrees. As a result of the dopant implantation process, the dopant concentration of the amorphous region 186 is increased, which leads to decreased contact resistance. In some embodiments, the second species are located within the amorphous region 186, because the amorphous region 186 can prevent the second species from channeling through the spaces between the crystal lattice structure.

In some embodiments, the dopant implantation process is performed before the amorphization process. For example, the dopant implantation process is performed to form a doped region in the third semiconductor material 156, and the doped region is located at the top of the third semiconductor material 156 and is exposed to the opening 180. The doped region of the third semiconductor material 156 has a dopant concentration substantially greater than the dopant concentration of the rest of the third semiconductor material.

In some embodiments, the second species (e.g., dopants) may be also introduced into the second semiconductor material 154 by the dopant implantation process. As a result, the dopant concentration of the second semiconductor material 154 in contact with the topmost first semiconductor layers 106 is increased, while the dopant concentration of the second semiconductor material 154 in contact with the first semiconductor layers 106 located below the topmost first semiconductor layers 106 is not affected by the dopant implantation process. Thus, in some embodiments, the dopant concentration of the second semiconductor material 154 in contact with the topmost first semiconductor layers 106 is substantially greater than the dopant concentration of the second semiconductor material 154 in contact with the first semiconductor layers 106 located below the topmost first semiconductor layers 106. Increasing the dopant concentration in the second semiconductor material 154 may lead to reduced electrical contact resistance between the second semiconductor material 154 and the first semiconductor layer 106.

In some embodiments, the second species is introduced into the second semiconductor material 154, such as the second semiconductor material 154 in contact with the topmost first semiconductor layers 106, but not the third semiconductor material 156. In other words, the dopant implantation process is performed to increase the dopant concentration of the second semiconductor material 154 in contact with the topmost first semiconductor layers 106 without increasing the dopant concentration of the third semiconductor material 156. The implantation tilt angle may range from about 15 degrees to about 45 degrees.

In some embodiments, because the dopant implantation process is performed before the amorphization process, the second species is not limited to being located within the amorphous region 186. As a result, the reducing of the contact resistance between the third semiconductor material 156 and a subsequently formed conductive feature and between the second semiconductor material 154 and the first semiconductor material 106 can be fine-tuned. In some embodiments, the height along the Z-direction of the doped region formed by the dopant implantation process is substantially greater than the height of the amorphous region 186. In some embodiments, when the amorphization process is performed after the dopant implantation process, the process temperature of the amorphization process is lower than the process temperature of the amorphization process when performed before the dopant implantation process. A lower process temperature may reduce the risk of damaging the gate electrode layers 172.

In some embodiments, the dopant implantation process is not performed.

After the amorphization process (with or without the dopant implantation process), the annealing process is performed to recrystallize the amorphous region 186. In some embodiments, the annealing process recrystallize any of the source/drain regions that were amorphous. For example, the annealing process may reorder the crystal structure of the amorphous region 186, redistribute the dopant atoms (e.g., first and second species) by incorporating the dopant atoms into the crystalline lattice of the third semiconductor material 156. Ordering the crystal lattice can reduce resistivity of the doped regions. Furthermore, the SPER process, which includes the amorphization process to convert a crystalline region to an amorphous region and the annealing process to recrystallize the amorphous region, can boost dopant activation. One of the reasons that the SPER process can boost dopant activation is that the dopant solubility after the SPER process may be greater than the maximum equilibrium solid solubility. Higher dopant activation also reduces resistivity. In addition, the high dopant concentration (if the n-type or p-type dopant is used in the amorphization process or the dopant implantation process is performed) can lead to reduced resistivity.

Figure 19:
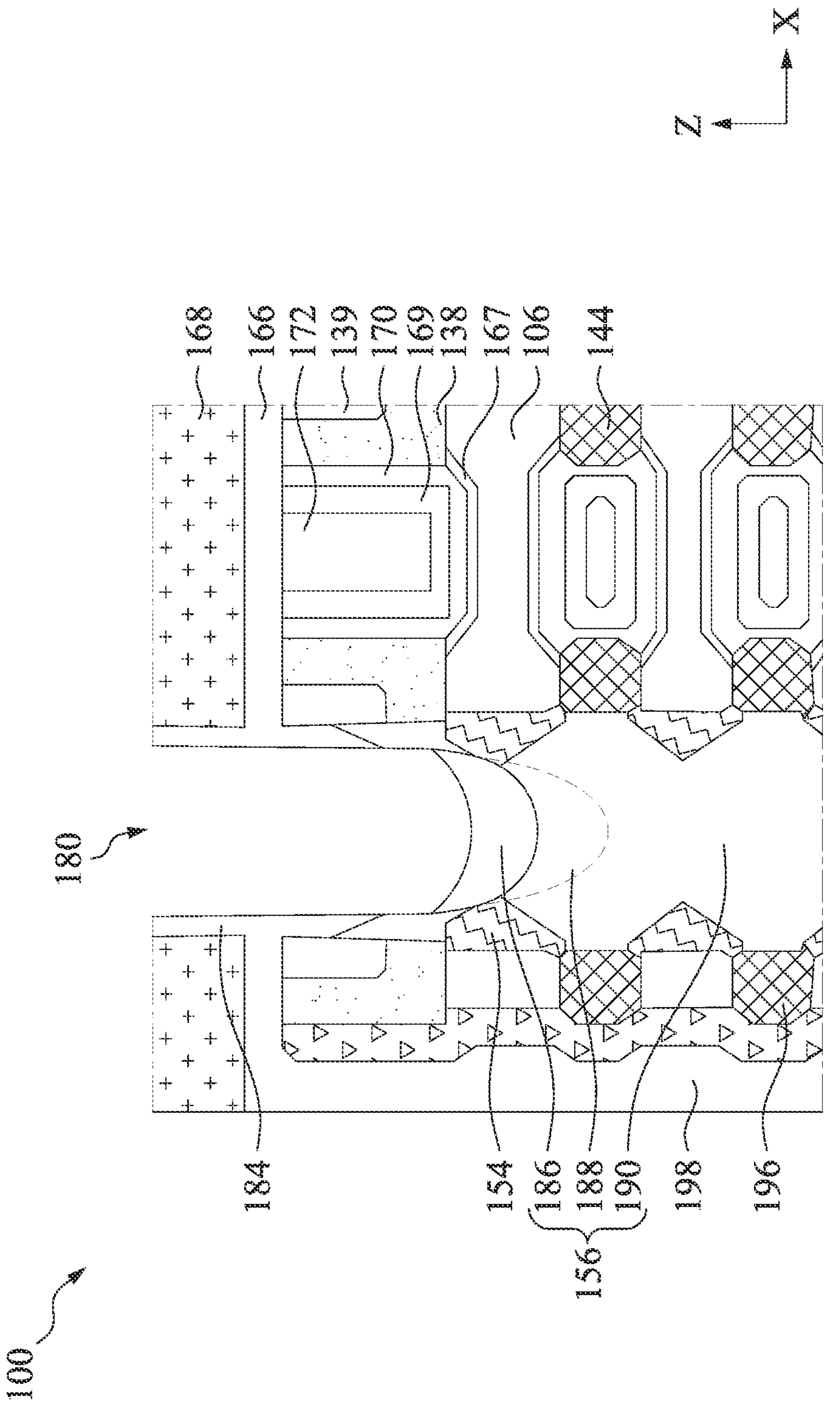

In some embodiments, as shown in FIG. 19, the annealing process recrystallizes a portion of the amorphous region 186. In other words, a portion of the amorphous region 186 is converted to a crystalline region 188, and a portion of the amorphous region 186 remains. In some embodiments, the portion of the amorphous region 186 in contact with the third semiconductor material 156 is recrystallized, while the portion of the amorphous region 186 exposed in the opening 180 remains to be amorphous. Thus, in some embodiments, the third semiconductor material 156 includes a crystalline region 190 (which is the as-deposited third semiconductor material 156), the crystalline region 188, and the amorphous region 186. The crystalline region 190 includes a first dopant and has a first dopant concentration as a result of the In-situ doping during the growth of the third semiconductor material 156. In some embodiments, the first species of the amorphization process and the second species of the dopant implantation process (if performed) are the same as the first dopant, and the crystalline region 188 includes the first dopant and a second dopant concentration substantially greater than the first dopant concentration. In some embodiments, the first species of the amorphization process is different from the first dopant and the second species of the dopant implantation process is the same as the first dopant. As a result, the crystalline region 188 includes the first dopant and the first species, and the dopant concentration of the first dopant is substantially the same as the first dopant concentration of the crystalline region 190. In some embodiments, the first species of the amorphization process and the second species of the dopant implantation process are different from the first dopant, and the crystalline region 188 includes the first dopant, the first species, and the second species, and the dopant concentration of the first dopant is substantially the same as the first dopant concentration of the crystalline region 190.

Similarly, in some embodiments, the first species of the amorphization process and the second species of the dopant implantation process (if performed) are the same as the first dopant, and the amorphous region 186 includes the first dopant and a second dopant concentration substantially greater than the first dopant concentration. In some embodiments, the first species of the amorphization process is different from the first dopant and the second species of the dopant implantation process is the same as the first dopant. As a result, the amorphous region 186 includes the first dopant and the first species, and the dopant concentration of the first dopant is substantially the same as the first dopant concentration of the crystalline region 190. In some embodiments, the first species of the amorphization process and the second species of the dopant implantation process are different from the first dopant, and the amorphous region 186 includes the first dopant, the first species, and the second species, and the dopant concentration of the first dopant is substantially the same as the first dopant concentration of the crystalline region 190.

The annealing process may be any suitable thermal process, such as rapid thermal annealing (RTA), millisecond annealing (MSA), microsecond annealing, flash annealing, laser annealing, or melting laser annealing. The annealing process may have an annealing temperature ranging from about 200 degrees Celsius to about 1200 degrees Celsius.

In some embodiments, the MSA process utilizes a laser anneal process to achieve the annealing times in the range of milliseconds. It is contemplated that a flash lamp annealing process or any advanced process using suitable optical radiation for performing an anneal for a very short amount of time, e.g., on a millisecond time scale, may also be used.

The laser anneal process may be performed by scanning a laser beam from an energy source across the exposed surface of the third semiconductor material 156. The laser beam may be applied/scanned sequentially to portions of the third semiconductor material 156. The energy source may be any type of laser such as gas laser, excimer laser, solid-state laser, fiber laser, semiconductor laser, etc. The laser beam may have a constant energy flux. The laser beam may be operated at a desired range of wavelengths and intensities. In some embodiments, the laser beam may have a wavelength in a range from about 200 nm to about 20 micrometers, such as from about 700 nm to about 1200 nm, for example about 950 nm to about 1000 nm, and an energy density in a range from about 0.1 $W/cm^2$ to about 10 $W/cm^2$. The laser anneal process can be performed so that each portion having the laser beam incident thereon can be momentarily elevated to a temperature of about 800 degrees Celsius or greater, such as about 850 degrees Celsius or greater, for example in a range from about 900 degrees Celsius to about 1200 degrees Celsius. During the laser anneal process, the chamber pressure may be maintained at about 10 Torr to about 850 Torr. The dwell time of the laser beam may be in a range from about 0.01 milliseconds to about 10 milliseconds, such as about 0.5 milliseconds to about 5 milliseconds, for example 0.1 milliseconds to 3 milliseconds.

As described above, in some embodiments, the entire amorphous region 186 shown in FIG. 18 is converted to a crystalline region. In some embodiments, a portion of the amorphous region 186 is converted to the crystalline region 188, as shown in FIG. 19. The remaining amorphous region 186 can enhance the growth of a subsequently formed silicide layer 192 (FIG. 20).

Figure 20:
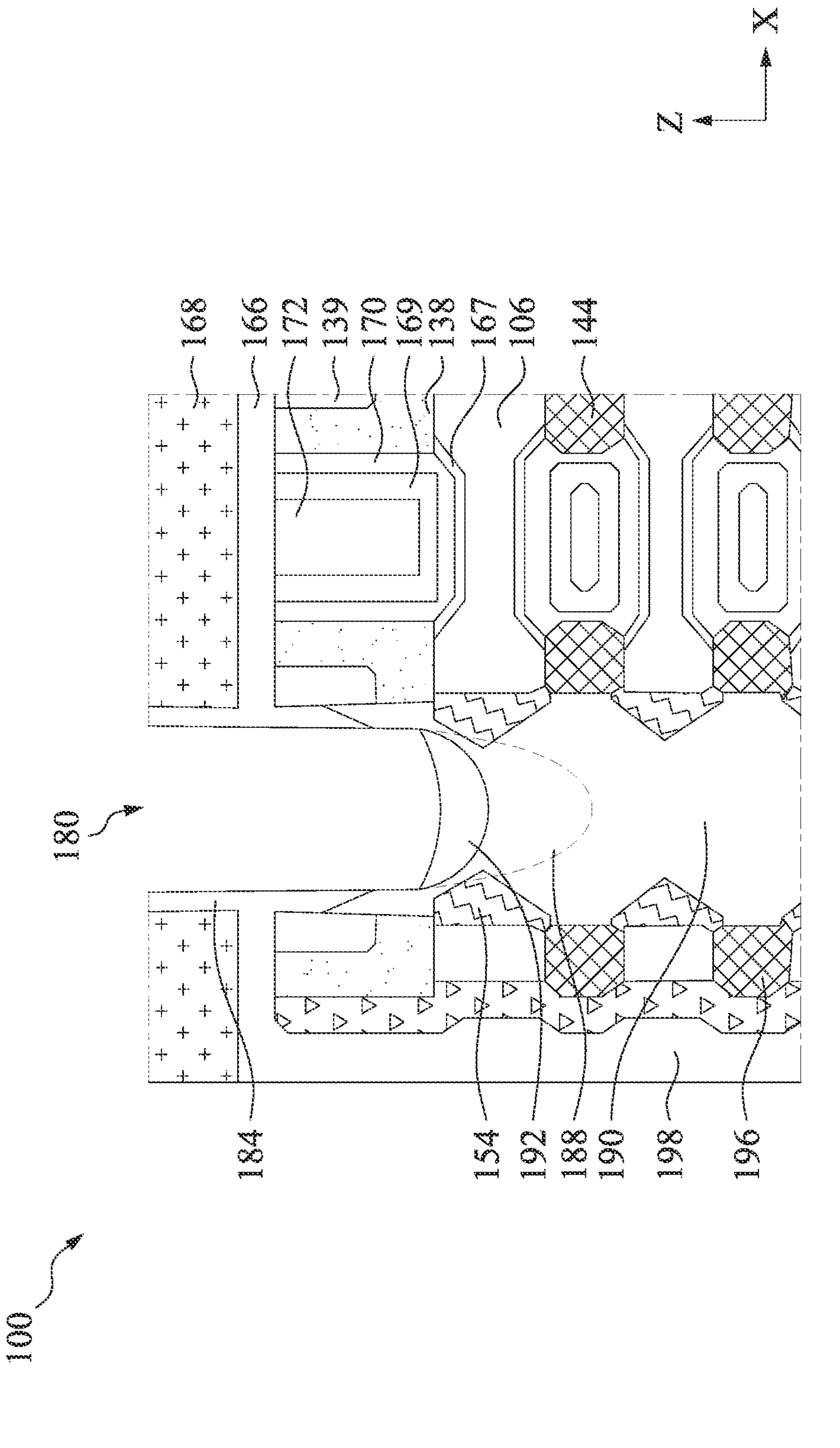

As shown in FIG. 20, the silicide layer 192 is formed from the amorphous region 186 (FIG. 19). When forming the silicide layer 192 from the amorphous region 186, the thickness of the silicide layer 192 is substantially greater than a thickness of a silicide layer formed from a crystalline region. In other words, the thickness of the amorphous region 186 is directly proportional to the thickness of the silicide layer 192. The thickness of the silicide layer 192 is inversely proportional to the sheet resistance Rs. As a result, the thick silicide layer 192 formed from the amorphous region 186 can lower resistance.

The silicide layer 192 may be formed by any suitable process. In some embodiments, a metal layer (not shown) is first formed on the semiconductor device structure 100. The metal layer may include Ti, Ni, Ru, Co, W, or other suitable metal. In some embodiments, the metal layer is a multi-layer structure. The multi-layer structure may include a metal layer and a metal nitride or metal oxide layer. The metal layer may be deposited by any suitable process, such as ALD, CVD, or PVD. After the metal layer deposition, an annealing process is performed to react the amorphous region 186 with the metal layer, thereby forming the silicide layers 192. In some embodiments, the entire amorphous region 186 is converted to the silicide layer 192. In other words, no amorphous region remains in the third semiconductor material 156 after the formation of the silicide layers 192. The silicide layer 192 may include any suitable material, such as NiSi, TiSi, CoSi, RuSi, or wSi.

As described above, in some embodiments, voids may be formed near the top of the third semiconductor material 156 as a result of growing the third semiconductor material 156 from the second semiconductor material 154. In some embodiments, voids may be formed at the interface between the third semiconductor material 156 and the silicide layer 192, if the SPER process is not performed. By performing the SPER process, which is forming the amorphous region 186 and partially or fully recrystallizing the amorphous region 186, voids formed near the top of the third semiconductor material 156 may be substantially removed, and there would be no or less voids formed at the interface between the third semiconductor material 156 and the silicide layer 192. In some embodiments, void defect may be decreased to less than about 10 percent, such as less than about five percent, for example less than about one percent (void per silicide to S/D region).

In some embodiments, the silicide layer 192, which is converted from the amorphous region 186, includes the first dopant (as a result of the in-situ doping during the growth of the third semiconductor material 156), the first species (as a result of the amorphization process), and optionally the second species (as a result of the dopant implantation process). In some embodiments, the first dopant and the first species (or the second species) include the same material. For example, the first dopant and the first species (or the second species) are boron. Boron from the epitaxy growth process includes two isotopes: about 20 percent of $^{10}B$ and about 80 percent of $^{11}B$. Boron from the ion implantation process of the amorphization process or the dopant implantation process includes 100 percent of 11B. Thus, in some embodiments, the silicide layer 192 includes a dopant having a first percentage of a first isotope and a second percentage of a second isotope. The crystalline region 190 of the third semiconductor material 156 includes the dopant having the third percentage of the first isotope and a fourth percentage of the second isotope. The first percentage of the first isotope may be substantially smaller than the third percentage of the first isotope, and the second percentage of the second isotope may be substantially greater than the fourth percentage of the second isotope. In some embodiments, the first percentage of the first isotope ranges from about 0 percent to about 5 percent, the second percentage of the second isotope ranges from about 95 percent to about 100 percent, the third percentage of the first isotope ranges from about 15 percent to about 25 percent, and the fourth percentage of the second isotope ranges from about 75 percent to about 85 percent.

After the formation of the silicide layer 192, the portion of the metal layer (not shown) not reacted may be removed by any suitable process, such as a selective etch process. A conductive feature is then formed in the opening 180 in contact with the silicide layer 192. The contact resistance between the S/D region (the third semiconductor material 156) and the conductive feature is reduced as a result of the thicker silicide layer 192, higher dopant activation in the crystalline region 188 of the third semiconductor material 156, and higher dopant concentration in the crystalline region 188 of the third semiconductor material 156.

Figure 21:
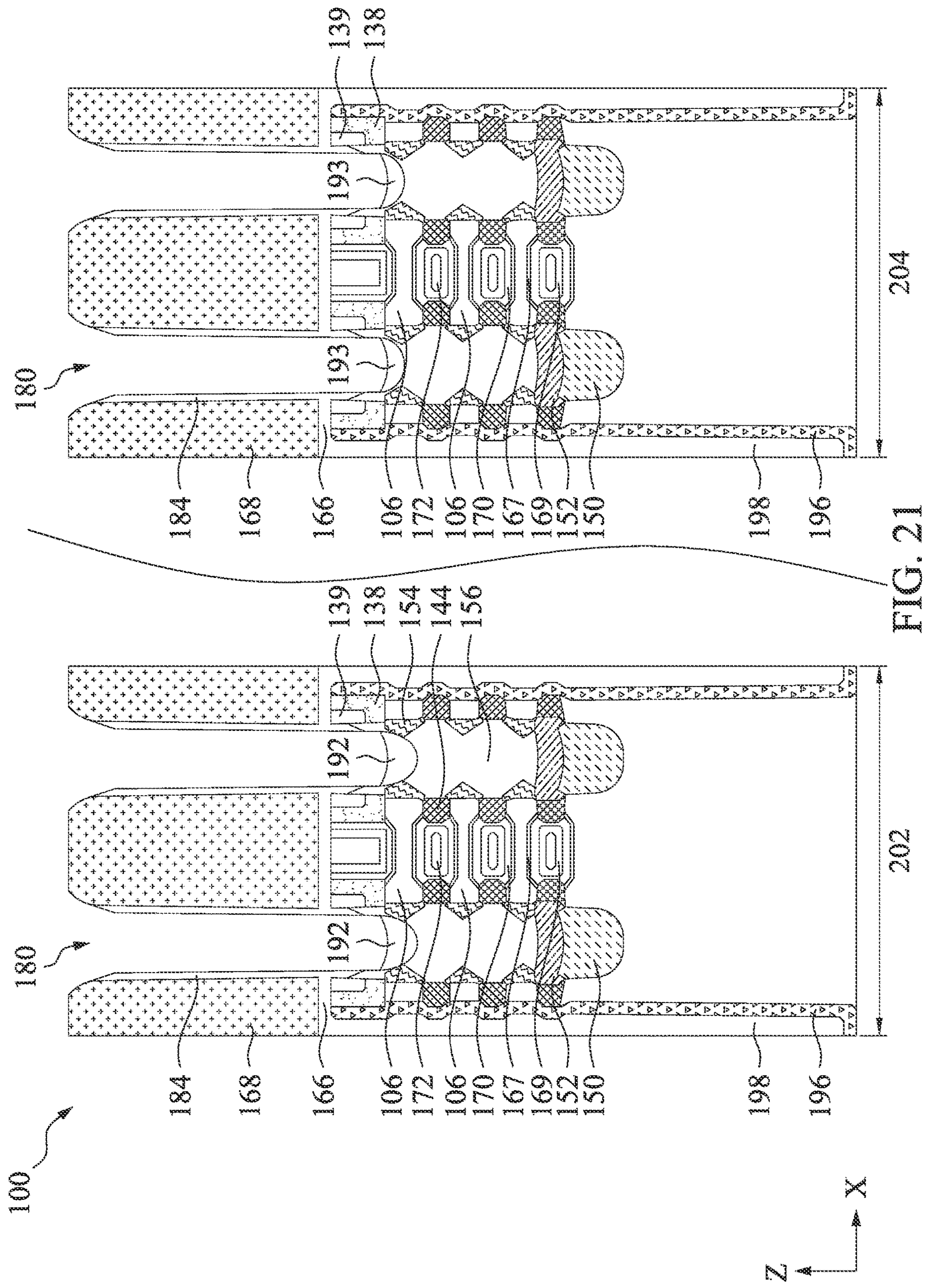
FIGS. 21-24 are cross-sectional side views of various stages of manufacturing the semiconductor device structure taken along line A-A of FIG. 5, in accordance with alternative embodiments.

In some embodiments, the contact resistance between a conductive feature and an n-type FET is different from the contact resistance between a conductive feature and a p-type FET. For example, in some embodiments, p-type FET has a higher contact resistance than the n-type FET. Thus, in some embodiments, the SPER process and the optional dopant implantation process are performed to one type of FET, while the other type of FET is covered by a mask layer during the SPER process and the optional dopant implantation process. In some embodiments, as shown in FIG. 21, the semiconductor device structure 100 includes a first region 202 and a second region 204. In some embodiments, the first region 202 is a p-type metal-oxide-semiconductor (PMOS) region, and the second region 204 is an n-type metal-oxide-semiconductor (NMOS) region. In some embodiments, the first region 202 is an NMOS region, and the second region 204 is a PMOS region. While not shown in scale in some figures, the first and second regions 202, 204 belong to a continuous substrate 101. In some embodiments, a first type devices, such as n-type devices or p-type devices, may be formed in the first region 202, while a second type of devices, such as p-type devices or n-type devices, may be formed in the second region 204. The first and second types are opposite types. N-type devices may be n-type FETs, and P-type devices may be p-type FETs.

As shown in FIG. 21, in some embodiments, the SPER process and the optional dopant implantation process are performed in the first region 202, while the second region 204 is covered by a mask layer (not shown). For example, after the SPER process and the optional dopant implantation process are performed in the first region 202, the mask layer in the second region 204 is removed. Next, the processes to form the silicide layers are performed in both first and second regions 202, 204. As a result, the silicide layer 192 formed in the first region 202 is substantially thicker than a silicide layer 193 formed in the second region 204. Furthermore, the dopant concentration of the silicide layer 193 is substantially greater than the dopant concentration of the silicide layer 192. The distribution of isotopes is also substantially different for the silicide layer 193 and the silicide layer 192. For example, the silicide layer 193 includes substantially more isotopes from the ion implantation process and the dopant implantation process than the silicide layer 192, while the silicide layer 192 includes substantially more isotopes from the epitaxy growth process than the silicide layer 193.

Furthermore, the third semiconductor material 156 located in the first region 202 may include a crystalline region 188 (FIG. 20) located below the silicide layer 193 having similar dopant concentration and isotope distribution as the silicide layer 193, while the third semiconductor material 156 located in the second region 204 has similar dopant concentration and isotope distribution as the crystalline region 190 (FIG. 20) of the third semiconductor material 156 located in the first region 202.

By performing the SPER process and the optional dopant implantation process on one of the PMOS and NMOS regions, the contact resistance between the conductive feature and the S/D region in both the NMOS region and the PMOS region may be substantially the same.

Figure 22:
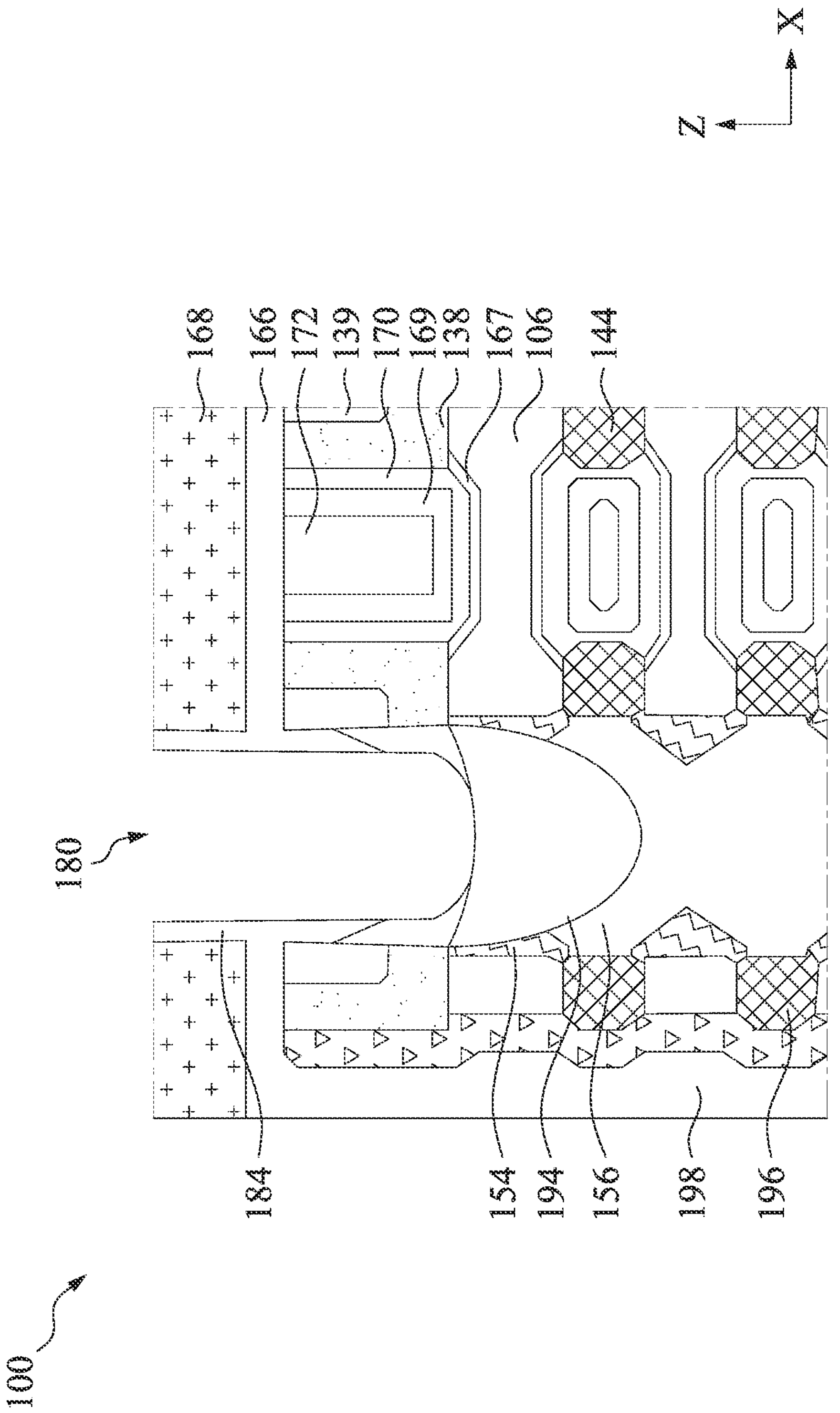

In some embodiments, the SPER process is performed on the third semiconductor material 156 to reduce contact resistance between the conductive feature and the S/D region, as described in FIG. 18. In some embodiments, the SPER process is performed on both the third semiconductor material 156 and the second semiconductor material 154 to also reduce the contact resistance between the S/D region and the channel regions (i.e., the first semiconductor layers 106). As shown in FIG. 22, an amorphous region 194 is formed in the top portion of the third semiconductor material 156 and in the second semiconductor material 154 in contact with the topmost first semiconductor layers 106. The amorphous region 194 may be formed by the amorphization process described in FIG. 18 to form the amorphous region 186. The dopant implantation process may be performed before or after the amorphization process. In some embodiments, the dopant implantation process is not performed.

Figure 23:
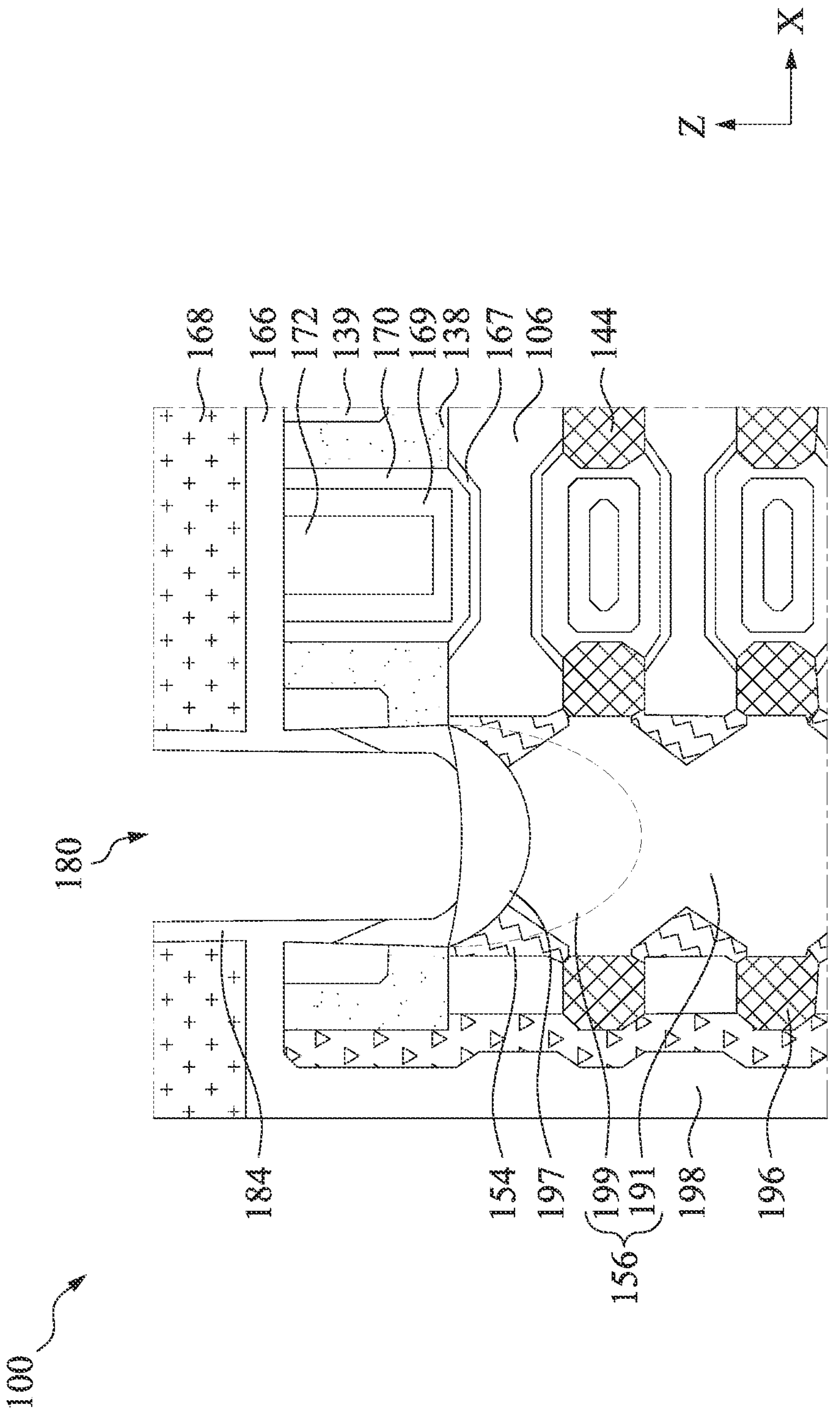

Next, as shown in FIG. 23, the annealing process described in FIG. 19 may be performed to fully or partially recrystallize the amorphous region 194, and a silicide layer 197 may be formed. The silicide layer 197 may include the same material, dopant concentration, and isotope distribution as the silicide layer 192. In some embodiments, as shown in FIG. 23, a crystalline region 199 is located below the silicide layer 197. The crystalline region 199 includes a portion of the third semiconductor material 156 and portions of the second semiconductor material 154 in contact with the topmost first semiconductor layers 106. The crystalline region 199 may be formed as a result of the recrystallization of the amorphous region 194. Thus, the dopant activation and dopant concentration of the third semiconductor material 156 located in the crystalline region 199 are substantially greater than those of a crystalline region 191 (which is the remaining as-deposited third semiconductor material 156). The isotope distribution of the third semiconductor material 156 located in the crystalline region 199 is different from that of the crystalline region 191. Similarly, the dopant activation and dopant concentration of the second semiconductor material 154 located in the crystalline region 199 are substantially greater than those of the second semiconductor material 154 in contact with the first semiconductor layers 106 located below the topmost first semiconductor layers 106. The isotope distribution of the second semiconductor material 154 located in the crystalline region 199 is different from that of the second semiconductor material 154 in contact with the first semiconductor layers 106 located below the topmost first semiconductor layers 106.

Figure 24:
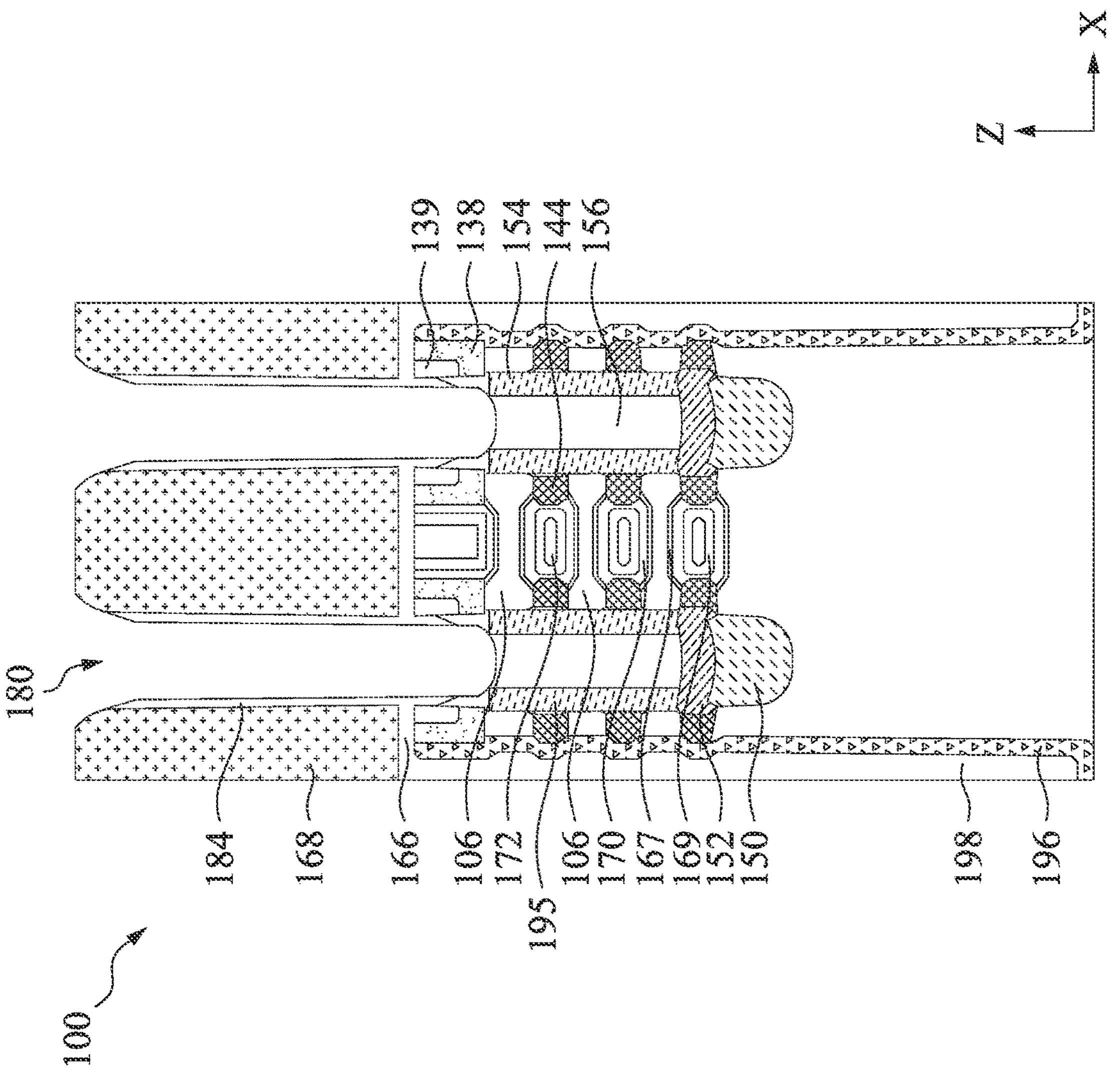

In some embodiments, the contact resistance between the S/D region and the channel regions (all of the first semiconductor layers 106) is reduced without substantially affecting the contact resistance between the S/D region and the conductive feature by performing the SPER process on the second semiconductor material 154 in contact with all of the first semiconductor layers 106. As shown in FIG. 24, in some embodiments, amorphous regions 195 are formed adjacent the first semiconductor layers 106 and the dielectric spacers 144. Each amorphous region 195 includes the second semiconductor material 154 and portions of the third semiconductor material 156 located between vertically adjacent second semiconductor material 154. The amorphous regions 195 may be formed by the amorphization process described in FIG. 18 to form the amorphous region 186. The dopant implantation process may be performed before or after the amorphization process. In some embodiments, the dopant implantation process is not performed. Next, the annealing process described in FIG. 19 may be performed to fully recrystallize the amorphous regions 195. The resulting crystalline regions include higher dopant concentration and dopant activation, which leads to reduced contact resistance between the S/D region and the channel regions. Furthermore, the portions of the third semiconductor material 156 located in the crystalline regions have a different isotope distribution compared to the portions of the third semiconductor material 156 located outside of the crystalline region.

Embodiments of the present disclosure provide a semiconductor device structure and methods of forming the same. In some embodiments, the method includes performing an amorphization process on a portion of the third semiconductor material 156 and/or second semiconductor material 154. A dopant implantation process may be optionally performed before or after the amorphization process. The doped region may be greater than, the same as, or smaller than the amorphous region formed by the amorphization process. The amorphous region is then partially or fully recrystallized. Some embodiments may achieve advantages. For example, partially recrystallized amorphous region can enhance the growth of the silicide layer 192. In addition, the dopant concentration and dopant activation of the recrystallized region are increased, which leads to reduced contact resistance.

An embodiment is a method. The method includes forming a fin structure from a substrate, depositing a first semiconductor material on a first semiconductor layer of the fin structure, depositing a second semiconductor material on the first semiconductor material, depositing an interlayer dielectric layer over the second semiconductor material, forming an opening in the interlayer dielectric layer to expose the second semiconductor material, and performing a dopant implantation process to form a doped region. The doped region includes a first portion of the second semiconductor material. Then, the method further includes performing an amorphization process to form an amorphous region, and the amorphous region includes a second portion of the second semiconductor material. The method further includes performing an annealing process to recrystallize the amorphous region.

Another embodiment is a method. The method includes forming a fin structure from a substrate, recessing a portion of the fin structure to expose a portion of the substrate, depositing a first semiconductor material over the portion of the substrate, depositing an interlayer dielectric layer over the first semiconductor material, forming an opening in the interlayer dielectric layer to expose the first semiconductor material, and performing an amorphization process to form an amorphous region. The amorphous region includes a portion of the first semiconductor material. The method further includes performing an annealing process to convert a first portion of the amorphous region to a first crystalline region and forming a silicide layer from a second portion of the amorphous region.

A further embodiment is a semiconductor device structure. The structure includes a plurality of semiconductor layers disposed over a substrate and a source/drain region disposed adjacent the plurality of semiconductor layers. The source/drain region includes a first semiconductor material in contact with each semiconductor layer of the plurality of semiconductor layers, the first semiconductor material in contact with a topmost semiconductor layer of the plurality of semiconductor layers has a first dopant concentration, and the first semiconductor material in contact with a semiconductor layer of the plurality of semiconductor layers disposed below the topmost semiconductor layer has a second dopant concentration substantially less than the first dopant concentration. The source/drain region further includes a second semiconductor material surrounding the first semiconductor material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method, comprising:

forming a fin structure from a substrate;

depositing a first semiconductor layer on a second semiconductor layer of the fin structure;

depositing a second semiconductor layer on the first semiconductor layer;

depositing an interlayer dielectric layer over the third semiconductor layer;

forming an opening in the interlayer dielectric layer to expose the third semiconductor layer;

performing a dopant implantation process to form a doped region, wherein the doped region includes a first portion of the third semiconductor layer; then performing an amorphization process to form an amorphous region, wherein the amorphous region includes a second portion of the third semiconductor layer; and performing an annealing process to recrystallize the amorphous region.

2. The method of claim 1, wherein a height of the first portion of the third semiconductor layer is substantially greater than a height of the second portion of the third semiconductor layer.

3. The method of claim 1, wherein the doped region includes portions of the first semiconductor layer.

4. The method of claim 1, wherein the amorphous region includes the first semiconductor layer.

5. The method of claim 1, wherein the fin structure comprises the second semiconductor layer, a fourth semiconductor layer located below the second semiconductor layer, and a fifth semiconductor layer located below the fourth semiconductor layer.

6. The method of claim 5, further comprising depositing a sixth semiconductor layer on the fourth semiconductor layer and a seventh semiconductor layer on the fifth semiconductor layer, wherein the third semiconductor layer is deposited on the sixth and seventh semiconductor layers.

7. The method of claim 6, wherein the fifth semiconductor layer is outside of the amorphous region.

8. A method, comprising:

forming a fin structure from a substrate;

recessing a portion of the fin structure to expose a portion of the substrate;

depositing a first semiconductor material over the portion of the substrate;

depositing an interlayer dielectric layer over the first semiconductor material;

forming an opening in the interlayer dielectric layer to expose the first semiconductor material;

performing an amorphization process to form an amorphous region, wherein the amorphous region includes a portion of the first semiconductor material;

performing an annealing process to convert a first portion of the amorphous region to a first crystalline region, wherein a second portion of the amorphous region remains amorphous after the annealing process; and forming a silicide layer from the second portion of the amorphous region.

9. The method of claim 8, wherein the first semiconductor material comprises a second crystalline region located below the first crystalline region.

10. The method of claim 9, wherein the first crystalline region has a dopant concentration substantially greater than a dopant concentration of the second crystalline region.

11. The method of claim 9, wherein the silicide layer has a dopant concentration substantially greater than the dopant concentration of the second crystalline region.

12. The method of claim 8, wherein the fin structure comprises a plurality of semiconductor layers.

13. The method of claim 12, further comprising depositing a second semiconductor material on each semiconductor layer of the plurality of semiconductor layers, wherein the first semiconductor material is deposited on the second semiconductor material.

14. The method of claim 13, wherein the amorphous region includes the second semiconductor material in contact with a topmost semiconductor layer of the plurality of semiconductor layers.

15. A semiconductor device structure, comprising:

a plurality of semiconductor layers disposed over a substrate;

a gate electrode layer disposed between vertically adjacent semiconductor layers of the plurality of semiconductor layers; and a source/drain region disposed adjacent the plurality of semiconductor layers, wherein the source/drain region comprises:

a first semiconductor material in contact with each semiconductor layer of the plurality of semiconductor layers, wherein the first semiconductor material in contact with a topmost semiconductor layer of the plurality of semiconductor layers has a first dopant concentration, and the first semiconductor material in contact with a semiconductor layer of the plurality of semiconductor layers disposed below the topmost semiconductor layer has a second dopant concentration substantially less than the first dopant concentration; and a second semiconductor material surrounding the first semiconductor material.

16. The semiconductor device structure of claim 15, further comprising a silicide layer disposed on the second semiconductor material.

17. The semiconductor device structure of claim 16, further comprising a first crystalline region disposed below the silicide layer and a second crystalline region disposed below the first crystalline region.

18. The semiconductor device structure of claim 17, wherein a dopant concentration of the first crystalline region is substantially greater than a dopant concentration of the second crystalline region.

19. The semiconductor device structure of claim 15, wherein the second semiconductor material has a dopant concentration gradient.

20. The semiconductor device structure of claim 15, further comprising a third semiconductor material disposed over the substrate and a dielectric layer disposed on the third semiconductor material, wherein the second semiconductor material is disposed on the dielectric layer.

* * * * *